(12) United States Patent
Harikrishna Mohan et al.

(10) Patent No.: US 9,178,185 B2
(45) Date of Patent: Nov. 3, 2015

(54) PATTERNING METHOD FOR OLEDS

(71) Applicant: Universal Display Corporation, Ewing, NJ (US)

(72) Inventors: Siddharth Harikrishna Mohan, Plainsboro, NJ (US); Paul E. Burrows, Chattaroy, WA (US); Julia J. Brown, Yardley, PA (US)

(73) Assignee: Universal Display Corporation, Ewing, NJ (US)

(*) Notice: Subject to any disclaimer, the term of this patent is extended or adjusted under 35 U.S.C. 154(b) by 0 days.

(21) Appl. No.: 14/581,594

(22) Filed: Dec. 23, 2014

(65) Prior Publication Data
US 2015/0111330 A1 Apr. 23, 2015

Related U.S. Application Data

(62) Division of application No. 13/600,444, filed on Aug. 31, 2012, now Pat. No. 8,940,568.

(51) Int. Cl.
H01L 51/56 (2006.01)
H01L 51/00 (2006.01)
H01L 51/50 (2006.01)
H01L 51/52 (2006.01)
H01L 27/32 (2006.01)

(52) U.S. Cl.
CPC ............ *H01L 51/56* (2013.01); *H01L 51/0005* (2013.01); *H01L 51/0008* (2013.01); *H01L 51/508* (2013.01); *H01L 51/5036* (2013.01); *H01L 51/5064* (2013.01); *H01L 51/5088* (2013.01); *H01L 51/525* (2013.01); *H01L 51/5265* (2013.01); *H01L 27/3206* (2013.01); *H01L 27/3211* (2013.01); *H01L 51/5004* (2013.01); *H01L 51/5253* (2013.01); *H01L 2251/558* (2013.01)

(58) Field of Classification Search
CPC ............ H01L 27/3206; H01L 27/3211; H01L 51/5004; H01L 51/5265; H01L 51/5036; H01L 51/5064; H01L 51/508; H01L 51/5088
See application file for complete search history.

(56) References Cited

U.S. PATENT DOCUMENTS

| 4,769,292 | A | 9/1988 | Tang et al. |
| 5,247,190 | A | 9/1993 | Friend et al. |
| 5,703,436 | A | 12/1997 | Forrest et al. |
| 5,707,745 | A | 1/1998 | Forrest et al. |
| 5,834,893 | A | 11/1998 | Bulovic et al. |
| 5,844,363 | A | 12/1998 | Gu et al. |
| 6,013,982 | A | 1/2000 | Thompson et al. |
| 6,087,196 | A | 7/2000 | Sturm et al. |

(Continued)

OTHER PUBLICATIONS

U.S. Appl. No. 13/595,160, filed Aug. 27, 2012.

(Continued)

Primary Examiner — Richard Booth
(74) Attorney, Agent, or Firm — Morris & Kamlay LLP

(57) ABSTRACT

Methods of fabricating a device having laterally patterned first and second sub-devices, such as subpixels of an OLED, are provided. Exemplary methods may include depositing via organic vapor jet printing (OVJP) a first organic layer of the first sub-device and a first organic layer of the second sub-device. The first organic layer of the first sub-device and the first organic layer of the second sub-device are both the same type of layer, but have different thicknesses. The type of layer is selected from an ETL, an HTL, an HIL, a spacer and a capping layer.

20 Claims, 15 Drawing Sheets

(56) References Cited

U.S. PATENT DOCUMENTS

| | | |
|---|---|---|
| 6,091,195 A | 7/2000 | Forrest et al. |
| 6,097,147 A | 8/2000 | Baldo et al. |
| 6,294,398 B1 | 9/2001 | Kim et al. |
| 6,303,238 B1 | 10/2001 | Thompson et al. |
| 6,337,102 B1 | 1/2002 | Forrest et al. |
| 6,468,819 B1 | 10/2002 | Kim et al. |
| 7,259,514 B2 | 8/2007 | Murayama et al. |
| 7,279,704 B2 | 10/2007 | Walters et al. |
| 7,431,968 B1 | 10/2008 | Shtein et al. |
| 7,601,988 B2 | 10/2009 | Seo et al. |
| 7,709,833 B2 | 5/2010 | Matsuda |
| 7,744,957 B2 | 6/2010 | Shtein et al. |
| 7,750,559 B2 | 7/2010 | Furugori |
| 8,143,613 B2 | 3/2012 | Forrest |
| 8,207,668 B2 | 6/2012 | Cok et al. |
| 2003/0230980 A1 | 12/2003 | Forrest et al. |
| 2004/0174116 A1 | 9/2004 | Lu et al. |
| 2012/0319145 A1 | 12/2012 | Weaver et al. |

OTHER PUBLICATIONS

Baldo, et al., "Highly Efficient Phosphorescent Emission from Organic Electroluminescent Devices", Nature, vol. 395, 151-154, (1998).

Baldo, et al., "Very high-efficiency green organic light-emitting devices based on electrophosphorescence,", Appl. Phys. Lett., vol. 75, No. 3, 4-6 (1999).

Bulovic, et al., "Weak microcavity effects in organic light-emitting devices", The American Physical Society, Physical Review B, vol. 58, No. 7, Aug. 15, 1998, pp. 3730-3740.

Burrows, et al., "Control of Microactivity Effects in Fill Color Stacked Organic Light Emitting Devices", Appl. Phys. Lett.; vol. 73, No. 435; (1998).

Dandrade, et al., "Blue Phosphorescent Organic Light Emitting Device Stability Analysis", UDC, Society for Information Display Digest of Technical Papers 34, 2, pp. 712-715, 2008.

Weaver, et al., "Phosphorescent OLEDs for Displays and Lighting", UDC, Proceedings of the International Display Manufacturing Conference, pp. 328-333, 2008.

PATTERNING METHOD FOR OLEDS

JOINT RESEARCH

The claimed invention was made by, on behalf of, and/or in connection with one or more of the following parties to a joint university corporation research agreement: Regents of the University of Michigan, Princeton University, University of Southern California, and the Universal Display Corporation. The agreement was in effect on and before the date the claimed invention was made, and the claimed invention was made as a result of activities undertaken within the scope of the agreement.

FIELD OF THE INVENTION

The present invention relates to methods of producing organic light emitting devices, and more specifically to manufacturing processes for providing layer thicknesses for microcavity optimization without the use of a shadow mask.

BACKGROUND

Opto-electronic devices that make use of organic materials are becoming increasingly desirable for a number of reasons. Many of the materials used to make such devices are relatively inexpensive, so organic opto-electronic devices have the potential for cost advantages over inorganic devices. In addition, the inherent properties of organic materials, such as their flexibility, may make them well suited for particular applications such as fabrication on a flexible substrate. Examples of organic opto-electronic devices include organic light emitting devices (OLEDs), organic phototransistors, organic photovoltaic cells, and organic photodetectors. For OLEDs, the organic materials may have performance advantages over conventional materials. For example, the wavelength at which an organic emissive layer emits light may generally be readily tuned with appropriate dopants.

OLEDs make use of thin organic films that emit light when voltage is applied across the device. OLEDs are becoming an increasingly interesting technology for use in applications such as flat panel displays, illumination, and backlighting. Several OLED materials and configurations are described in U.S. Pat. Nos. 5,844,363, 6,303,238, and 5,707,745, which are incorporated herein by reference in their entirety.

One application for phosphorescent emissive molecules is a full color display. Industry standards for such a display call for pixels adapted to emit particular colors, referred to as "saturated" colors. In particular, these standards call for saturated red, green, and blue pixels. Color may be measured using CIE coordinates, which are well known to the art.

One example of a green emissive molecule is tris(2-phenylpyridine)iridium, denoted $Ir(ppy)_3$, which has the structure of Formula I:

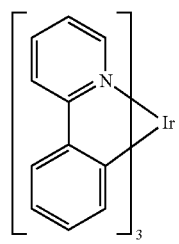

In this, and later figures herein, we depict the dative bond from nitrogen to metal (here, Ir) as a straight line.

As used herein, the term "organic" includes polymeric materials as well as small molecule organic materials that may be used to fabricate organic opto-electronic devices. "Small molecule" refers to any organic material that is not a polymer, and "small molecules" may actually be quite large. Small molecules may include repeat units in some circumstances. For example, using a long chain alkyl group as a substituent does not remove a molecule from the "small molecule" class. Small molecules may also be incorporated into polymers, for example as a pendent group on a polymer backbone or as a part of the backbone. Small molecules may also serve as the core moiety of a dendrimer, which consists of a series of chemical shells built on the core moiety. The core moiety of a dendrimer may be a fluorescent or phosphorescent small molecule emitter. A dendrimer may be a "small molecule," and it is believed that all dendrimers currently used in the field of OLEDs are small molecules.

As used herein, "top" means furthest away from the substrate, while "bottom" means closest to the substrate. Where a first layer is described as "disposed over" a second layer, the first layer is disposed further away from substrate. There may be other layers between the first and second layer, unless it is specified that the first layer is "in contact with" the second layer. For example, a cathode may be described as "disposed over" an anode, even though there are various organic layers in between.

As used herein, "solution processible" means capable of being dissolved, dispersed, or transported in and/or deposited from a liquid medium, either in solution or suspension form.

A ligand may be referred to as "photoactive" when it is believed that the ligand directly contributes to the photoactive properties of an emissive material. A ligand may be referred to as "ancillary" when it is believed that the ligand does not contribute to the photoactive properties of an emissive material, although an ancillary ligand may alter the properties of a photoactive ligand.

As used herein, and as would be generally understood by one skilled in the art, a first "Highest Occupied Molecular Orbital" (HOMO) or "Lowest Unoccupied Molecular Orbital" (LUMO) energy level is "greater than" or "higher than" a second HOMO or LUMO energy level if the first energy level is closer to the vacuum energy level. Since ionization potentials (IP) are measured as a negative energy relative to a vacuum level, a higher HOMO energy level corresponds to an IP having a smaller absolute value (an IP that is less negative). Similarly, a higher LUMO energy level corresponds to an electron affinity (EA) having a smaller absolute value (an EA that is less negative). On a conventional energy level diagram, with the vacuum level at the top, the LUMO energy level of a material is higher than the HOMO energy level of the same material. A "higher" HOMO or LUMO energy level appears closer to the top of such a diagram than a "lower" HOMO or LUMO energy level.

As used herein, and as would be generally understood by one skilled in the art, a first work function is "greater than" or "higher than" a second work function if the first work function has a higher absolute value. Because work functions are generally measured as negative numbers relative to vacuum level, this means that a "higher" work function is more negative. On a conventional energy level diagram, with the vacuum level at the top, a "higher" work function is illustrated as further away from the vacuum level in the downward direction. Thus, the definitions of HOMO and LUMO energy levels follow a different convention than work functions.

More details on OLEDs, and the definitions described above, can be found in U.S. Pat. No. 7,279,704, which is incorporated herein by reference in its entirety.

SUMMARY OF THE INVENTION

This present invention is related to the field of OLED manufacturing. In particular, the invention provides methods for forming a pattern of different layer thicknesses, e.g. for microcavity optimization, without the use of a shadow mask. As discussed further below, different thicknesses of organic layers may be achieved, for example, by depositing organic layers of similar functional type using organic vapor jet printing (OVJP), or similar processes.

As used herein, OVJP should be understood as a deposition process that typically includes the steps of 1) heating an organic material in a crucible, causing it to evaporate, 2) passing an inert carrier gas such as nitrogen over the hot organic material, thereby entraining organic vapor within the carrier gas, and 3) flowing the carrier gas with the organic vapor down a tube, where it is ejected onto a substrate via a nozzle to form a thin, laterally patterned organic film. In embodiments, the substrate may be cooled to assist with the deposition of the film.

Embodiments of OVJP generally involve a "jet" of gas ejected from the nozzle, as distinct from other techniques, such as OVPD (organic vapor phase deposition), where a carrier gas may be used, but there is no "jet." A "jet" occurs when the flow velocity through the nozzle is sufficiently large to result in a significantly anisotropic velocity distribution relative to the isotropic velocity distribution of the molecules in a stagnant gas. One way of defining when a jet occurs is when the flow velocity of the carrier gas is at least 10% of the thermal velocity of the carrier gas molecules.

One unique aspect of OVJP is that the organic species may be accelerated by the flow of a much lighter carrier gas to hyperthermal velocities. This can lead to denser and more ordered thin films, which potentially broadens the processing window for ultra-rapid growth of high quality thin films for device applications. This acceleration may also allow the instantaneous local deposition rate of OVJP to exceed that of the alternative broad-area deposition methods, resulting in an advantage in the rapid printing of large-scale electronics.

Because OVJP does not use liquid solvents, it may allow for greater latitude in the choice of substrate material and shape than other processes such as ink-jet printing, thereby permitting a wider variety of organic semiconductors and structures to be deposited. The molecules used for organic devices typically have vapor pressures of up to several millibar, allowing high practical deposition rates. OVJP is preferably used to deposit small molecule organic materials because they generally have sufficient vapor pressure at reasonable temperatures to allow for a high deposition rate. However, OVJP may have applications to other materials, such as polymers.

According to first aspects of the invention, a method of fabricating a device having at least laterally patterned first and second sub-devices is provided. The method may include depositing a first organic layer of the first sub-device and a first organic layer of the second sub-device. In embodiments, the first organic layer of the first sub-device and the first organic layer of the second sub-device may have different thicknesses. As used herein, a "different thickness" is intended to signify a difference that is intended, and is typically greater than the mere processing imperfections in deposited layers that are otherwise intended to be the same thickness. In embodiments, the first organic layer of the first sub-device and the first organic layer of the second sub-device may be deposited with different thicknesses without the use of a shadow mask, for example, the first organic layer of the first sub-device and/or the first organic layer of the second sub-device may be deposited via OVJP.

In embodiments, the first organic layer of the first sub-device and the first organic layer of the second sub-device may both be the same type of layer. For example, both layers may be an electron transport layer (ETL), a hole transport layer (HTL), a hole injection layer (HIL), a spacer or a capping layer.

Embodiments may also include steps of providing first and second electrodes to each of the first and second sub-devices. At least one of the first and second electrodes of the first and second sub-devices may typically be individually addressable, although one or both may be common electrodes.

In embodiments, the first organic layer of the first sub-device and the first organic layer of the second sub-device may have the same material composition.

In embodiments, the first organic layer of the first sub-device and the first organic layer of the second sub-device may have different material compositions.

In embodiments, the first organic layer of the first sub-device and the first organic layer of the second sub-device may be deposited at the same time.

In embodiments, the first organic layer of the first sub-device and the first organic layer of the second sub-device may be deposited at the same time and have the same material composition.

In embodiments, the first organic layer of the first sub-device and the first organic layer of the second sub-device may be deposited at different times.

In embodiments, the first organic layer of the first sub-device and the first organic layer of the second sub-device may be deposited at different times and have the same material composition.

In embodiments, the first organic layer of the first sub-device and the first organic layer of the second sub-device may be deposited at different times and have different material compositions.

In embodiments, the first organic layer of the first sub-device and the first organic layer of the second sub-device may be disposed within optical cavities.

In embodiments, the first and second sub-devices may be OLEDs.

In embodiments, the first and second sub-devices may each emit a different color of light.

In embodiments, the device may further include a third sub-device, and the first, second and third sub-devices may each emit a different color of light. For example, the first, second and third devices may each emit a different color selected from red, green and blue.

In embodiments, the first organic layer of the first sub-device and the first organic layer of the second sub-device may have a thickness difference greater than, for example, approximately 5 Å approximately 10 Å, or approximately 20 Å.

In embodiments, the first organic layer of the first sub-device and the first organic layer of the second sub-device have a thickness difference in a range of approximately 10 Å-100 Å, or in a range of approximately 10 Å-1000 Å.

In embodiments, the lateral separation between the first and second sub-devices is at most approximately 1.0 mm.

In embodiments, the first organic layer of the first sub-device and the first organic layer of the second sub-device may both be HTLs, and a hole transport property of the first organic layer of the first sub-device may be different from a hole transport property of the first organic layer of the second sub-device.

In embodiments, the first organic layer of the first sub-device and the first organic layer of the second sub-device may both be HTLs, and a triplet state energy of the first organic layer of the first sub-device is within 0.3 eV of a triplet state energy of the first organic layer of the second sub-device.

In embodiments, the device may be a consumer device.

In embodiments, the device may be incorporated into an optoelectronic device, such as in a vehicle, a computer, a television, a printer, a large area wall, a theater or stadium screen, a billboard, or a sign.

As used herein, "emitters," "emitting layers," and "emissive dopants" should be understood as encompassing those structures and materials that are intended to emit in the actual device(s). That is, although some structures and/or materials may exhibit incidental and/or unintended emissions at a certain low-level (e.g. less than 5% of photons emitted), such emissions are not considered to fall within the claimed "emitters," "emitting layers," or "emissive dopants" unless specifically indicated. To the extent that emissive dopants are claimed, they should also not be considered as including, or corresponding to, the host material, even in the event that the host itself is emissive or exhibits incidental emissions. That is, an "emissive dopant" is generally used to identify a minority component that is intended to emit in the device (e.g. greater than 5% of the photons emitted). Emission from the hole and/or electron transport layers are generally not considered as falling within the definition either.

As used herein, a "spacer" layer should generally be understood as including layers used to control the cavity length in a device. These may be, for example, a substantially transparent layer that increases the separation of an emissive layer from one of the surfaces of a microcavity in which the emissive layer sits. In embodiments, the spacer layer may be an extra thickness added to the HTL or ETL. The spacer layer may be an unpatterned layer, or it may be patterned. The spacer layer may be deposited by the same, or different, methods than the adjacent emissive layer.

As used herein, a "capping" may refer to a layer of material that is deposited over the top electrode of an OLED (which is typically the cathode). The capping layer is typically used to enhance the amount of light outcoupled from the OLED. The layer may be made of any suitable material (such as $Alq_3$), and is preferably transparent, semi-transparent, or translucent. The term "total capping layer" may refer to the combination of all of the capping layers disposed over (and optically coupled to) an OLED. For instance, if a first and second capping layer are disposed over an OLED such that they are all optically coupled, the total capping layer of the OLED is the combination of the first and second capping layers. The "total optical thickness" is the optical thickness of the total capping layer. The capping layer may be deposited by the same, or different, methods than the adjacent layer.

The materials used for spacer and/or capping layers may be chosen based on various intended effects, such as to control microcavity emission, to provide an optical effect, or to prevent contamination between multiple emissive, or other, layers. For example, a transparent layer can be incorporated in or on each color OLED and designed to be the correct thickness to optimize the microcavity for that particular color. According to aspects of the invention, spacing and/or capping layers may be manufactured with organic materials using OVJP deposition. However, the invention is not limited to such embodiments, and exemplary devices may include other inorganic materials in non-OVJP deposited layers, for example, capping layers with materials such as LiF.

According to further aspects of the invention, devices and sub-devices such as those described herein may be provided in, for example, a multi-color pixel, or a white-light application. Exemplary devices may be included in a system that includes only one type of emitter, e.g. a white light emitter in a cool white light system, or they may be included with other color emitters, each of which may represent different color pixels of a color display, e.g. an RGB display.

As used herein, "red" means having a peak wavelength in the visible spectrum of 600-700 nm, "green" means having a peak wavelength in the visible spectrum of 500-600 nm. Other color emitters are also contemplated as within the scope of the invention.

As used herein, "light blue" and "dark blue" may both generally refer to having a peak wavelength of between 400 to 500 nanometers. In embodiments, a peak wavelength of between 400 to 470 nanometers may refer to "deep blue" and a peak wavelength of between 460 to 500 may refer to "tight blue." However, "light blue" and "deep blue" may also be used in the relative sense when comparing emissive dopants included in the same device. For example, a "light blue dopant" may be understood as the dopant having a peak wavelength that is (1) between 400 to 500 nanometers, and (2) greater than (e.g. at least 4 nm greater than) the peak wavelength of another dopant having a peak wavelength of between 400 to 500 (i.e. a "dark blue dopant").

Any first, second or third sub-devices described herein each have at least one emissive layer that includes a phosphorescent or fluorescent organic material that emits light when an appropriate voltage is applied across the device.

Any first, second or third sub-devices described herein may have the same surface area, or may have different surface areas.

Further advantages of the present subject matter will become apparent to those of ordinary skill in the art upon reading and understanding the following detailed description of the preferred embodiments.

BRIEF DESCRIPTION OF THE DRAWINGS

The accompanying drawings, which are included to provide a further understanding of the invention, are incorporated in and constitute a part of this specification, illustrate embodiments of the invention and together with the detailed description serve to explain the principles of the invention. No attempt is made to show structural details of the invention in more detail than may be necessary for a fundamental understanding of the invention and various ways in which it may be practiced. In the drawings.

DETAILED DESCRIPTION

Figure 1:
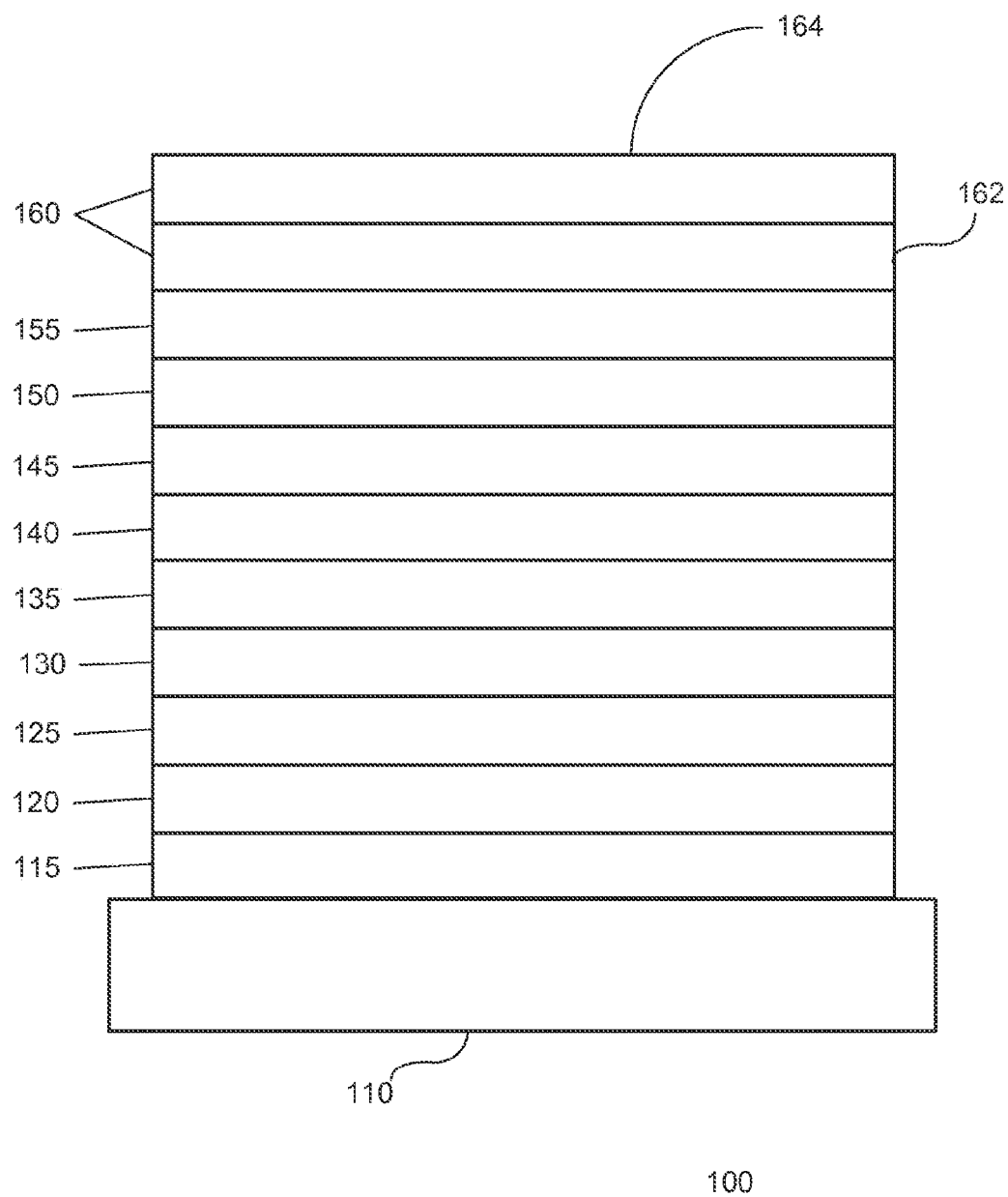
FIG. 1 shows an organic light emitting device.

It is understood that the invention is not limited to the particular methodology, protocols, and reagents, etc., described herein, as these may vary as the skilled artisan will recognize. It is also to be understood that the terminology used herein is used for the purpose of describing particular embodiments only, and is not intended to limit the scope of the invention. It also is be noted that as used herein and in the appended claims, the singular forms "a," "an," and "the" include the plural reference unless the context clearly dictates otherwise. Thus, for example, a reference to "a pixel" is a reference to one or more pixels and equivalents thereof known to those skilled in the art.

Unless defined otherwise, all technical and scientific terms used herein have the same meanings as commonly understood by one of ordinary skill in the art to which the invention pertains. The embodiments of the invention and the various features and advantageous details thereof are explained more fully with reference to the non-limiting embodiments and examples that are described and/or illustrated in the accompanying drawings and detailed in the following description. It should be noted that the features illustrated in the drawings are not necessarily drawn to scale, and features of one embodiment may be employed with other embodiments as the skilled artisan would recognize, even if not explicitly stated herein. Descriptions of well-known components and processing techniques may be omitted so as to not unnecessarily obscure the embodiments of the invention. The examples used herein are intended merely to facilitate an understanding of ways in which the invention may be practiced and to further enable those of skill in the art to practice the embodiments of the invention. Accordingly, the examples and embodiments herein should not be construed as limiting the scope of the invention, which is defined solely by the appended claims and applicable law. Moreover, it is noted that like reference numerals reference similar parts throughout the several views of the drawings.

Generally, an OLED comprises at least one organic layer disposed between and electrically connected to an anode and a cathode. When a current is applied, the anode injects holes and the cathode injects electrons into the organic layer(s). The injected holes and electrons each migrate toward the oppositely charged electrode. When an electron and hole localize on the same molecule, an "exciton," which is a localized electron-hole pair having an excited energy state, is formed. Light is emitted when the exciton relaxes via a photoemissive mechanism. In some cases, the exciton may be localized on an excimer or an exciplex. Non-radiative mechanisms, such as thermal relaxation, may also occur, but are generally considered undesirable.

The initial OLEDs used emissive molecules that emitted light from their singlet states ("fluorescence") as disclosed, for example, in U.S. Pat. No. 4,769.292, which is incorporated by reference in its entirety. Fluorescent emission generally occurs in a time frame of less than 10 nanoseconds.

More recently, OLEDs having emissive materials that emit light from triplet states ("phosphorescence") have been demonstrated. Baldo et al., "Highly Efficient Phosphorescent Emission from Organic Electroluminescent Devices," Nature, vol. 395, 151-154, 1998; ("Baldo-I") and Baldo et al., "Very high-efficiency green organic light-emitting devices based on electrophosphorescence," Appl. Phys. Lett., vol. 75, No. 3, 4-6 (1999) ("Baldo-II"), which are incorporated by reference in their entireties. Phosphorescence is described in more detail in U.S. Pat. No. 7,279,704 at cols. 5-6, which are incorporated by reference.

FIG. 1 shows an organic light emitting device 100. The figures are not necessarily drawn to scale. Device 100 may include a substrate 110, an anode 115, a hole injection layer 120, a hole transport layer 125, an electron blocking layer 130, an emissive layer 135, a hole blocking layer 140, an electron transport layer 145, an electron injection layer 150, a protective layer 155, and a cathode 160. Cathode 160 is a compound cathode having a first conductive layer 162 and a second conductive layer 164. Device 100 may be fabricated by depositing the layers described, in order. The properties and functions of these various layers, as well as example materials, are described in more detail in U.S. Pat. No. 7,279,704 at cols. 6-10, which are incorporated by reference.

More examples for each of these layers are available. For example, a flexible and transparent substrate-anode combination is disclosed in U.S. Pat. No. 5,844,363, which is incorporated by reference in its entirety. An example of a p-doped hole transport layer is m-MTDATA doped with F.sub.4-TCNQ at a molar ratio of 50:1, as disclosed in U.S. Patent Application Publication No. 2003/0230980, which is incorporated by reference in its entirety. Examples of emissive and host materials are disclosed in U.S. Pat. No. 6,303,238 to Thompson et al., which is incorporated by reference in its entirety. An example of an n-doped electron transport layer is BPhen doped with Li at a molar ratio of 1:1, as disclosed in U.S. Patent Application Publication No. 2003/0230980, which is incorporated by reference in its entirety. U.S. Pat. Nos. 5,703,436 and 5,707,745, which are incorporated by reference in their entireties, disclose examples of cathodes including compound cathodes having a thin layer of metal such as Mg:Ag with an overlying transparent, electrically-conductive, sputter-deposited ITO layer. The theory and use of blocking layers is described in more detail in U.S. Pat. No. 6,097,147 and U.S. Patent Application Publication No. 2003/0230980, which are incorporated by reference in their entireties. Examples of injection layers are provided in U.S. Patent Application Publication No. 2004/0174116, which is incorporated by reference in its entirety. A description of protective layers may be found in U.S. Patent Application Publication No. 2004/0174116, which is incorporated by reference in its entirety.

Figure 2:
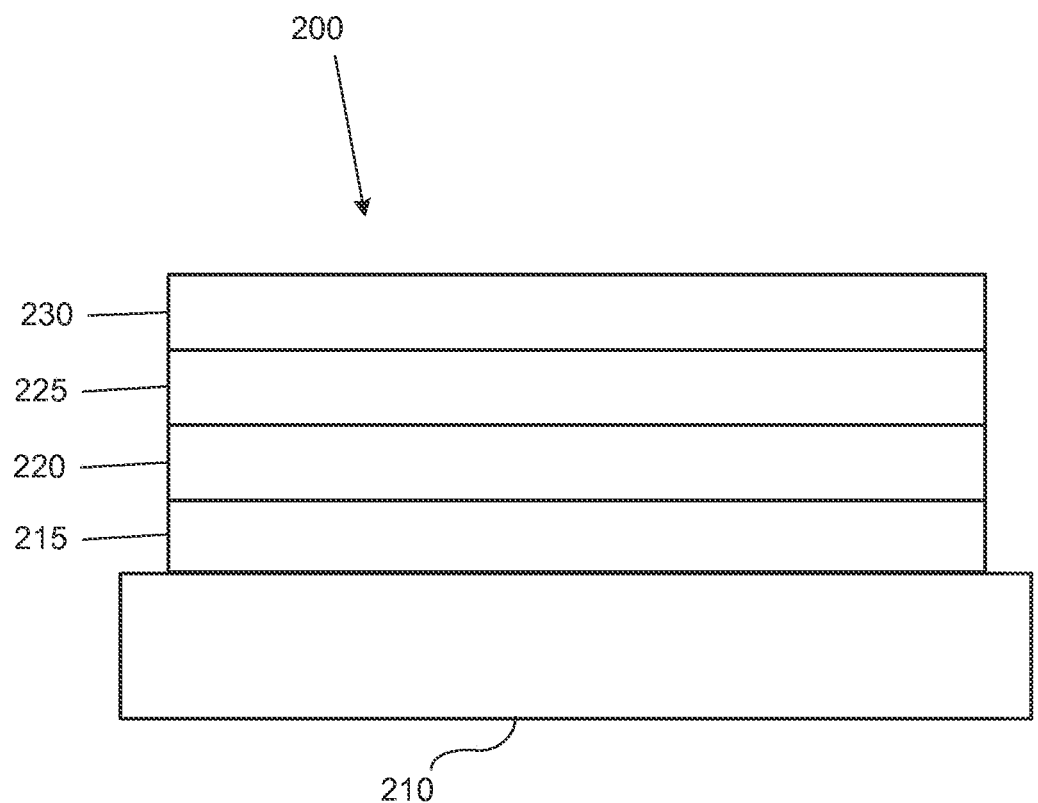
FIG. 2 shows an inverted organic light emitting device that does not have a separate electron transport layer.

FIG. 2 shows an inverted OLED 200. The device includes a substrate 210, a cathode 215, an emissive layer 220, a hole transport layer 225, and an anode 230. Device 200 may be fabricated by depositing the layers described, in order. Because the most common OLED configuration has a cathode disposed over the anode, and device 200 has cathode 215 disposed under anode 230, device 200 may be referred to as an "inverted" OLED. Materials similar to those described with respect to device 100 may be used in the corresponding layers of device 200. FIG. 2 provides one example of how some layers may be omitted from the structure of device 100.

The simple layered structure illustrated in FIGS. 1 and 2 is provided by way of non-limiting example, and it is understood that embodiments of the invention may be used in connection with a wide variety of other structures. The specific materials and structures described are exemplary in nature, and other materials and structures may be used. Functional OLEDs may be achieved by combining the various layers described in different ways, or layers may be omitted entirely, based on design, performance, and cost factors. Other layers not specifically described may also be included. Materials other than those specifically described may be used. Although many of the examples provided herein describe various layers as comprising a single material, it is understood that combinations of materials, such as a mixture of host and dopant, or more generally a mixture, may be used. Also, the layers may have various sublayers. The names given to the various layers herein are not intended to be strictly limiting. For example, in device 200, hole transport layer 225 transports holes and injects holes into emissive layer 220, and may be described as a hole transport layer or a hole injection layer. In one embodiment, an OLED may be described as having an "organic layer" disposed between a cathode and an anode. This organic layer may comprise a single layer, or may further comprise multiple layers of different organic materials as described, for example, with respect to FIGS. 1 and 2.

Structures and materials not specifically described may also be used, such as OLEDs comprised of polymeric materials (PLEDs) such as disclosed in U.S. Pat. No. 5,247,190 to Friend et al., which is incorporated by reference in its entirety. By way of further example, OLEDs having a single organic layer may be used. OLEDs may be stacked, for example as described in U.S. Pat. No. 5,707,745 to Forrest et al, which is incorporated by reference in its entirety. The OLED structure may deviate from the simple layered structure illustrated in FIGS. 1 and 2. For example, the substrate may include an angled reflective surface to improve out-coupling, such as a mesa structure as described in U.S. Pat. No. 6,091,195 to Forrest et al., and/or a pit structure as described in U.S. Pat. No. 5,834,893 to Bulovic et al., which are incorporated by reference in their entireties.

Although aspects of the invention specifically relate to forming a pattern of different layer thicknesses using OVJP, it should be understood that, unless otherwise specified, any of the layers of the various embodiments may be deposited by any suitable method. For the organic layers, preferred methods include thermal evaporation, ink-jet, such as described in U.S. Pat. Nos. 6,013,982 and 6,087,196, which are incorporated by reference in their entireties, organic vapor phase deposition (OVPD), such as described in U.S. Pat. No. 6,337,102 to Forrest et al., which is incorporated by reference in its entirety, and deposition by OVJP, such as described in U.S. Pat. Nos. 7,431,968 and 7,744,957, which are incorporated by reference in their entireties. Other suitable deposition methods include spin coating and other solution based processes. Solution based processes are preferably carried out in nitrogen or an inert atmosphere. For the other layers, preferred methods include thermal evaporation. Preferred patterning methods include deposition through a mask, cold welding such as described in U.S. Pat. Nos. 6,294,398 and 6,468,819, which are incorporated by reference in their entireties, and patterning associated with some of the deposition methods such as ink-jet and OVJD. Other methods may also be used. The materials to be deposited may be modified to make them compatible with a particular deposition method. For example, substituents such as alkyl and aryl groups, branched or unbranched, and preferably containing at least 3 carbons, may be used in small molecules to enhance their ability to undergo solution processing. Substituents having 20 carbons or more may be used, and 3-20 carbons is a preferred range. Materials with asymmetric structures may have better solution processibility than those having symmetric structures, because asymmetric materials may have a lower tendency to recrystallize. Dendrimer substituents may be used to enhance the ability of small molecules to undergo solution processing.

Devices fabricated in accordance with embodiments of the invention may be incorporated into a wide variety of consumer products, including lights for interior or exterior illumination and/or signaling, laser printers, flat panel displays, computer monitors, televisions, billboards, heads up displays, fully transparent displays, flexible displays, telephones, cell phones, personal digital assistants (PDAs), laptop computers, digital cameras, camcorders, viewfinders, micro-displays, vehicles, a large area wall, theater or stadium screen, or a sign. Various control mechanisms may be used to control devices fabricated in accordance with the present invention, including passive matrix and active matrix. Many of the devices are intended for use in a temperature range comfortable to humans, such as 18 degrees C. to 30 degrees C., and more preferably at room temperature (20-25 degrees C.).

The materials and structures described herein may have applications in devices other than OLEDs. For example, other optoelectronic devices such as organic solar cells and organic photodetectors may employ the materials and structures. More generally, organic devices, such as organic transistors, may employ the materials and structures.

The terms halo, halogen, alkyl, cycloalkyl, alkenyl, alkynyl, arylkyl, heterocyclic group, aryl, aromatic group, and heteroaryl are known to the art, and are defined in U.S. Pat. No. 7,279,704 at cols. 31-32, which are incorporated herein by reference.

As discussed previously, a typical OLED device comprises anode, organic layers and cathode. Either the anode or cathode or both is typically a TCO or thin metal. The organic emissive layer therefore sits in a weak microcavity which influences the spectral content and efficiency of the emitted light. This effect is described, for example, in P. E. Burrows et al., Appl. Phys. Lett. 73, 435 (1998) or V. Bulovic, V. B. Khalfin et al., Phys. Rev. B. 58, 3730 (1998) and references therein.

Because of the microcavity effect, it is sometimes desirable to use different organic stack thicknesses to optimize different colors emitted from a laterally-patterned OLED panel, or to use different transparent layer thicknesses to preferentially select different colors from a broad-band or white emission spectrum. For example, a display might include separately patterned R, G and B sub-pixels and each of these pixels might have a different HTL thickness in order to optimize the efficiency and spectral purity of each color. Alternatively, an OLED lamp might be comprised of laterally-patterned R, G and B stripes, each of which might include an emitter layer located in microcavities of differing optical path lengths.

Such microcavity structures can be tuned by adjusting the thickness of the HTL, ETL, EML or some combination of multiple layers. Alternatively, a transparent layer can be incorporated in or on each color OLED and designed to be the correct thickness to optimize the microcavity for that particular color.

There is, therefore, a need for a manufacturable method to deposit laterally-patterned OLEDs on a substrate with not only EML layers of different composition (e.g. R, G, B emitters) but also charge transport or inert layers of different thickness. The term "manufacturable" is meant to imply a low-cost and high throughput process.

One problem in particular involves limiting the overspray of one light emitting material onto the HTL of adjacent pixels of different color. This problem is particularly important to solve because even a very small amount of emitter layer contamination (<<1 monolayer) can significantly affect the performance of an OLED. We have found that careful design of the nozzle shape(s) and arrangement can minimize overspray. See, e.g., co-pending U.S. patent application Ser. No. 13/595,160, the contents of which are hereby incorporated by reference.

However, the inventors have found that it is possible to control the thickness of laterally-patterned ETL, HTL or other organic spacer, capping or other layers using OVJP with far less concern for small amounts of overspray, and therefore fewer constraints on the nozzle design. The inventors have demonstrated this, for example, by using an OVJP-deposited HTL to optimize the microcavity length of a green OLED.

The inventors have previously disclosed that an EML may effectively be patterned by OVJP. For example, the inventors have determined a workable combination of OVJP precision and tolerance for overspray that makes the patterning of even EML layers, which are extremely sensitive to cross-contamination, possible with a simple nozzle design. In this regard, it is also noted that other known patterning techniques, such as vacuum thermal evaporation (VTE), ink-jet printing (IJP), or nozzle printing, are impractical for patterning of EML of organic emitting pixels over large areas because of the non-scalability of shadow masks, and the impossibility of depositing pixels with a combination of good efficiency and good lifetime using IJP. The inventors have further discovered that the patterning of the HTL or ETL is easier to accomplish using OVJP because a small (~few monolayer) overspray of the HTL or ETL onto an adjacent patterned electrode will not substantially affect the performance of the device.

Accordingly, as discussed below with respect to certain exemplary embodiments, aspects of the invention may include using, for example, OVJP to deposit at least one layer of an OLED so that it is laterally patterned with different thicknesses over different parts of the substrate. The OVJP-patterned layer might be the HTL, the ETL, or both. Furthermore the OVJP-patterned layer might be an additional layer not between the OLED electrodes, e.g. a layer on top of the transparent cathode of a top-emitting device or underneath the transparent anode of a bottom-emitting device. Exemplary devices may also be described in the context of devices including three sub-devices (or subpixels). However, it should be understood that the techniques are equally applicable to devices including only two sub devices, or more than three sub devices.

In the following embodiments, the substrate includes a first electrode. The substrate may be glass, plastic or metal foil and the first electrode may be a metal or a TCO. The substrate may include a first electrode that is patterned so as to form sub-pixels. For clarity, one or more similarly functioning layers may be referred to by common numbers throughout the various embodiments, e.g. a "first electrode" 310, an HTL 320, an EML 330, an ETL 340, and a "second electrode" 350. However, this is in no way intended to imply that such commonly-numbered layers are in all respects identical, as will be apparent.

A first embodiment is described with reference to FIG. 3: A substrate/first electrode 310 may be loaded into an OVJP chamber. An HTL 320 (and/or an HIL) may be deposited using OVJP so that a first thickness of HTL and/or HIL is deposited on a first set of sub-pixels 410. A second thickness of HIL and/or HTL may be deposited on a second set of sub-pixels 420. A third thickness of HIL and/or HTL may be deposited on a third set of sub-pixels 430. In this example, and the others that follow, the "first thickness," "second thickness" and "third thickness" are to be understood as different thicknesses, i.e. including a difference that is intended, and is typically greater than the mere processing imperfections in deposited layers that are otherwise intended to be the same thickness. For example, the first thickness, second thickness and third thickness may include differences greater than approximately 5 Å, approximately 10 Å, or approximately 20 Å. The different thicknesses may alternatively be in a range of, for example, 10 Å-100 Å, or in a range of approximately 10 Å-1000 Å. It should be noted that, unless otherwise specified, references to HTL in the following descriptions of the figures may also refer to variations in HIL, the HIL and HTL, or other transparent layer(s) involved in hole transport.

Figure 3:
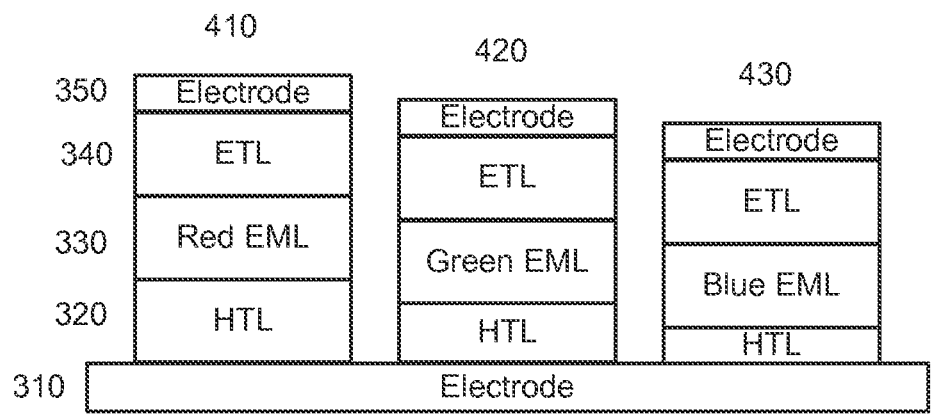
FIG. 3 shows a schematic cross sections of a device structure with different thicknesses of HTL.

In embodiments such as shown in FIG. 3, in which the HTL includes different thicknesses, (1) a hole transport property of the HTL in the first sub-pixel 410 may be different from a hole transport property of the HTL in the second sub-pixel 420 and/or the third sub-pixel 430, and/or (2) a triplet state energy of the HTL in the first sub-pixel 410 may be within 0.3 eV of a triplet state energy of the HTL of the second sub-pixel 420 and/or the third sub-pixel 430.

In embodiments, the lateral separation between each of sub-pixels 410, 420 and 430, may be, for example, at most approximately 1.0 mm, or other appropriate distance for white light OLED pixels or multi-color OLED pixels.

In this embodiment, and various others described below, it should be understood that the layer including different thicknesses may be deposited substantially at the same time (e.g. by using OVJP jets with different deposition rates), or at different times, which may include, for example, drawing different lines of material at different times with different rates of deposition or pass-speed, or providing additional passes on the "thicker" portion of the layer. The layer having different thicknesses may include substantially similar materials, such as in some cases of HTL, HIL, ETL, spacer or capping layers, or may include different materials, such as different organic emitting compounds in an EML of a multi-color OLED pixel. In this regard, it should also be understood that the use of the term "layer" is not necessarily meant to imply a contiguous or simultaneously formed structural element. Rather, "layers" having different thicknesses more generally refer to similar (though not necessarily identical) structural elements that typically share a relative functional position in an OLED stack.

Returning to FIG. 3, an EML 330 may then be deposited, e.g. using VTE and shadow mask(s), or other techniques including OVJP. Optionally, a different EML may be deposited on each set of sub-pixels 410, 420, 430, such as a Red EML, a Green EML, and a Blue EML. As discussed further herein, a blue EML may include a combination of light blue and deep blue emitters. The device may be finished conventionally using VTE, possibly including deposition of an ETL 340 and a top second electrode 350.

Figure 4:
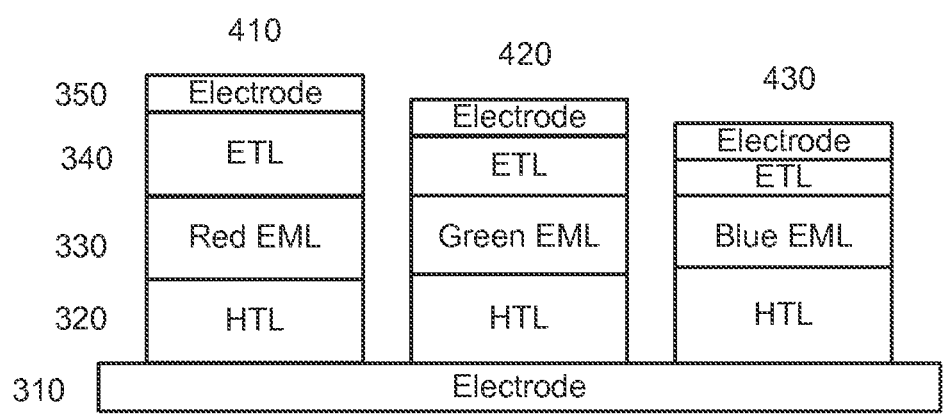
FIG. 4 shows a schematic cross sections of a device structure with different thicknesses of ETL.

A second embodiment is described with reference to FIG. 4: HIL and/or HTL 320 and EML 330 may all be deposited on sets of sub-pixels 410, 420, 430, conventionally using VTE and (optionally) shadow masks (the shadow mask being optionally used if different thicknesses and/or compositions are used for different sub-pixels). The substrate may be subsequently loaded into an OVJP chamber, and a first thickness of ETL 340 is deposited on a first set of subpixels 410 and a second thickness of ETL 340 is deposited on a second set of sub-pixels 420. A third thickness of ETL 340 may be deposited on a third set of sub-pixels 430.

A second electrode 350 may be deposited, for example, using conventional VTE.

Figure 5:
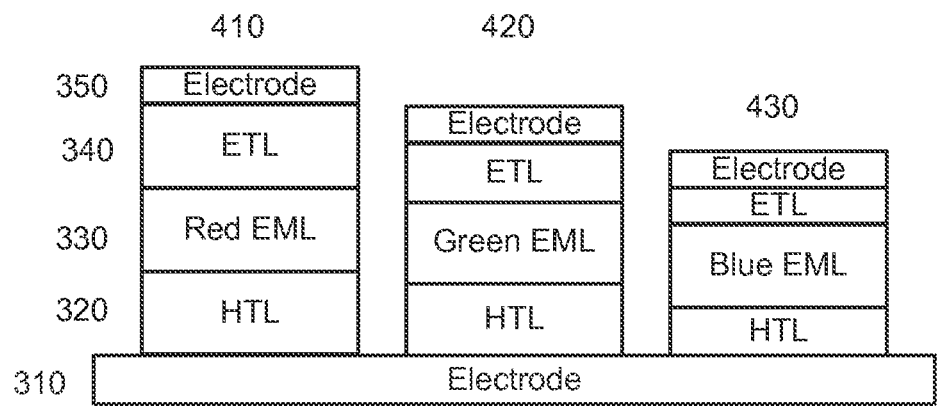
FIG. 5 shows a schematic cross sections of a device structure with different thicknesses of ETL and HTL.

A third embodiment is described with reference to FIG. 5. A first thickness of HIL and/or HTL 320 is deposited on a first set of sub-pixels 410 and a second thickness of HIL and/or HTL 320 is deposited on a second set of sub-pixels 420, e.g. using OVJP. A third thickness of HIL and/or HTL 320 may be deposited on a third set of sub-pixels 430, e.g. by OVJP.

An EML 330 may then be deposited, e.g. OVJP, or other techniques. Optionally, a different EML may be deposited on each set of sub-pixels 410, 420, 430, such as a Red EML, a Green EML and a Blue EML. Of note, the EML 330 in FIG. 5 may have the same or different thicknesses.

A first thickness of ETL 340 is deposited on the first set of sub-pixels 410, and a second thickness of ETL 340 is deposited on the second set of sub-pixels 420 also using OVJP. A third thickness of ETL 340 may be deposited on the third set of sub-pixels 430, e.g. by OVJP. Thus, the device shown in FIG. 5 may have multiple layers including different thicknesses, all deposited by similar methods, e.g. HTL 320 and ETL 340, and optionally EML 330, may each include different thicknesses.

The remainder of the device, including second electrode 350, may be finished, for example, using conventional VTE and shadow masks.

Figure 6:
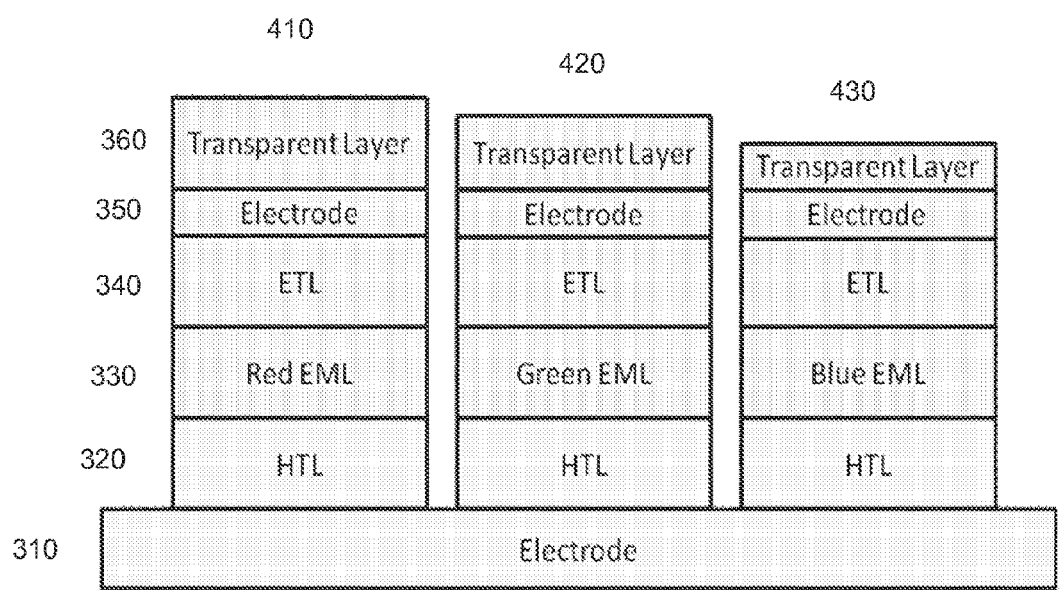
FIG. 6 shows a schematic cross sections of a device structure with different thicknesses of a transparent capping layer.

A fourth embodiment is described with reference to FIG. 6. At least two arrays of OLEDs are deposited using, for example, conventional VTE or inkjet methods. The arrays may include first sub-pixels 410 and second sub-pixels 420, each including a first electrode 310, an HTL 320, an EML 330, an ETL 340, and a second electrode 350. A third array including third sub-pixels 430 may also be formed.

After completion of these portions of the sub-pixels, a first thickness of a transparent material layer 360 may be deposited on the first sub-pixels 410 and a second thickness of transparent material layer 360 may be deposited on the second sub-pixels 420. A third thickness of transparent material layer 360 may also be deposited on the third sub-pixels 430.

In embodiments, each sub-pixel 410, 420 and/or 430 may comprise EML 330 of the same, or different colors.

In all of the foregoing embodiments, the thickness of layers deposited by OVJP may be adjusted so as to optimize the color purity and/or optical outcoupling efficiency of light from the first, second and/or third sets of sub-pixels, respectively.

The different sets of sub-pixels may have different EMLs which emit at different peak wavelengths, which each require a different optical cavity length to match the desired spectral peak and optimize outcoupling efficiency. Alternatively, there may be a common EML across the sets of sub-pixels, but it is desired to select a different peak wavelength range from each set of sub-pixels. This may be accomplished by building a different microcavity around the EML on each set of sub-pixels.

Many different device structures may be manufactured according to the principles described above, and by forming additional layers, some with different thicknesses, outside of the electrodes of the device, some of which are depicted in FIGS. 7-22. These devices may include first electrode 310, HTL 320, EML 330, ETL 340 and second electrode 350 layers, which may be formed in similar manner to those embodiments previously discussed, unless otherwise specified.

Figure 7:
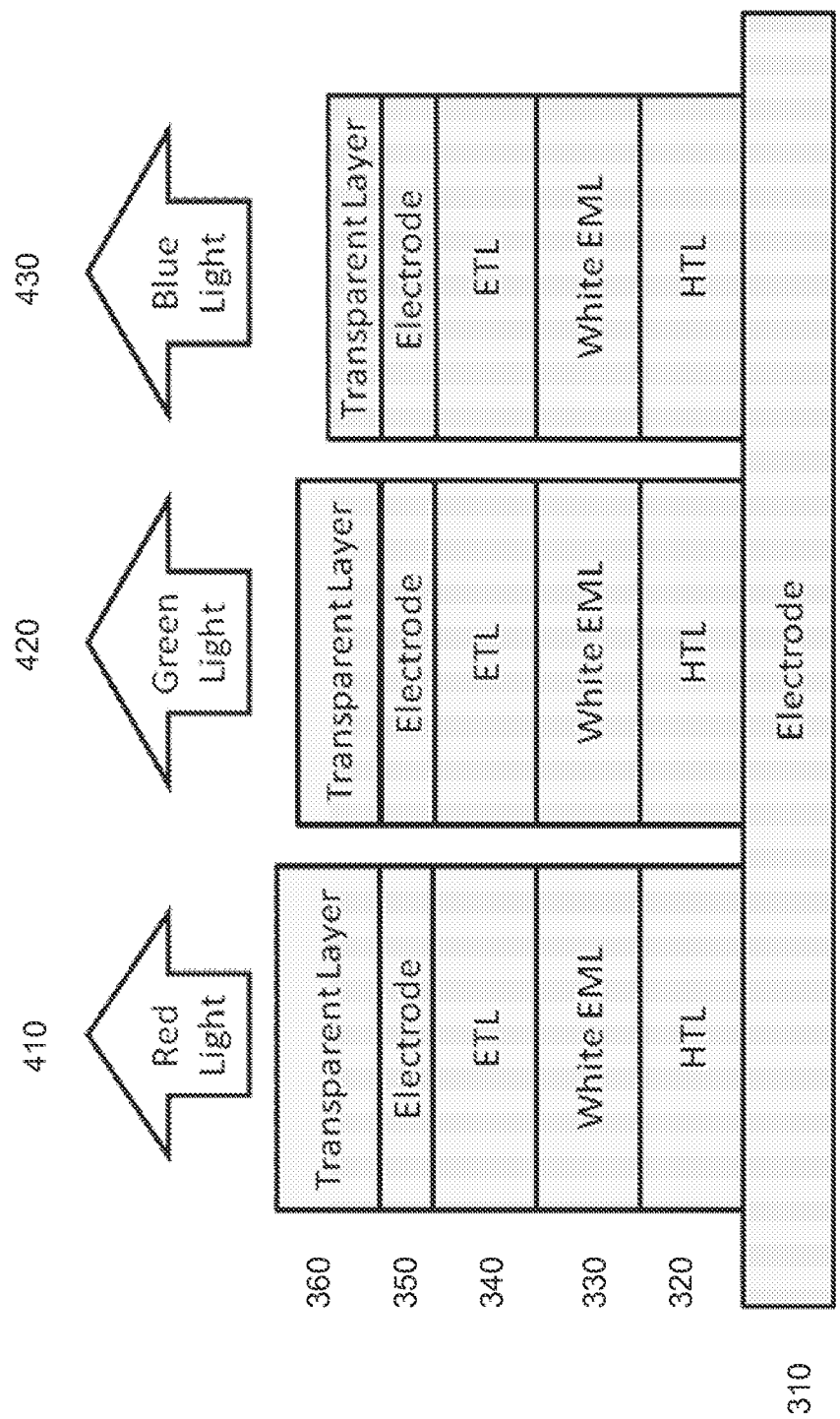
FIG. 7 shows a schematic cross sections of a device structure with different thicknesses of a transparent layer configured to optimize the outcoupling of different component colors of a white light emitter.

For example, FIG. 7 shows a schematic cross section of a top-emitting multi-color device structure with different thicknesses of a transparent capping layer 360 configured to optimize the outcoupling of different component colors of a white light EML 330. The appropriate thicknesses of the transparent layer 360 may be conveniently formed, for example, by OVJP, without significant concern for the effect of overspray on the second electrode 350.

Figure 8:
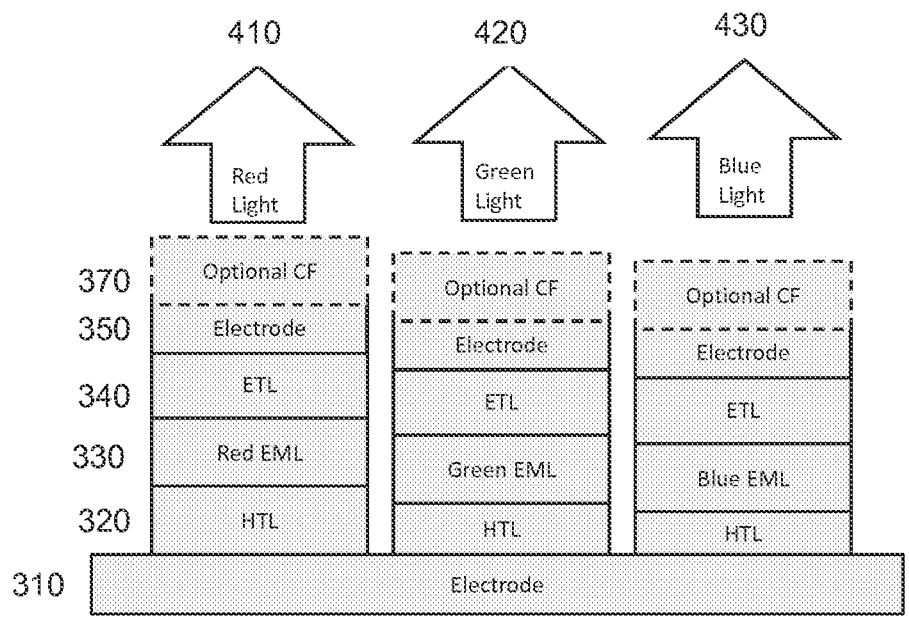
FIG. 8 shows a schematic cross sections of a top-emitting device structure with different thicknesses of an HTL and optional color filter layers over the sub-pixels.

FIG. 8 shows a schematic cross section of a top-emitting device structure with different thicknesses of HTL 320 (such as previously described), and includes different colored EML 330 and color filter layer 370 over the sub-pixels 410, 420, 430. Color filter layers, such as layer 370, may be used for various reasons depending on the configuration of the device and the color of the EML. For example, a color filter layer may be used to cut the long wavelength tail on a blue emitter, which can be important because, since the eye sensitivity is greater in the green, just a small amount of tailing can significantly reduce the color saturation.

Figure 9:
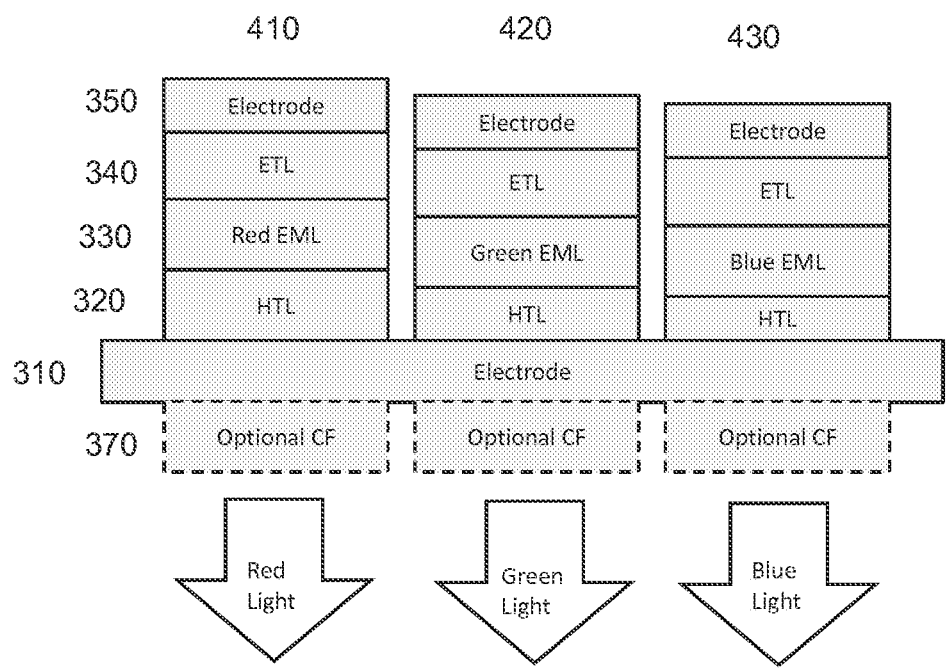
FIG. 9 shows a schematic cross sections of a bottom-emitting device structure with different thicknesses of an HTL and optional color filter layers under the transparent substrate.

FIG. 9 shows a schematic cross section of a bottom-emitting device structure with different thicknesses of HTL 320, and includes different colored EML 330 and color filter layer 370 under the transparent substrate/electrode 310.

Figure 10:
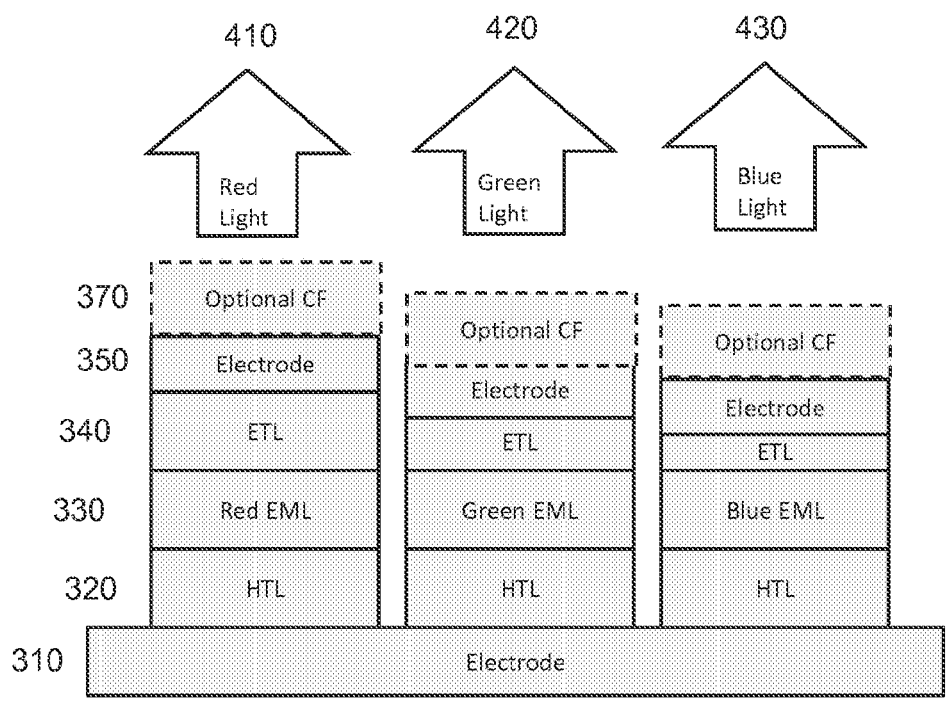
FIG. 10 shows a schematic cross sections of a top-emitting device structure with different thicknesses of an ETL and optional color filter layers over the sub-pixels.

FIG. 10 shows a schematic cross section of a top-emitting device structure with different thicknesses of ETL 340, and includes different colored EML 330 and color filter layer 370 over the sub-pixels.

Figure 11:
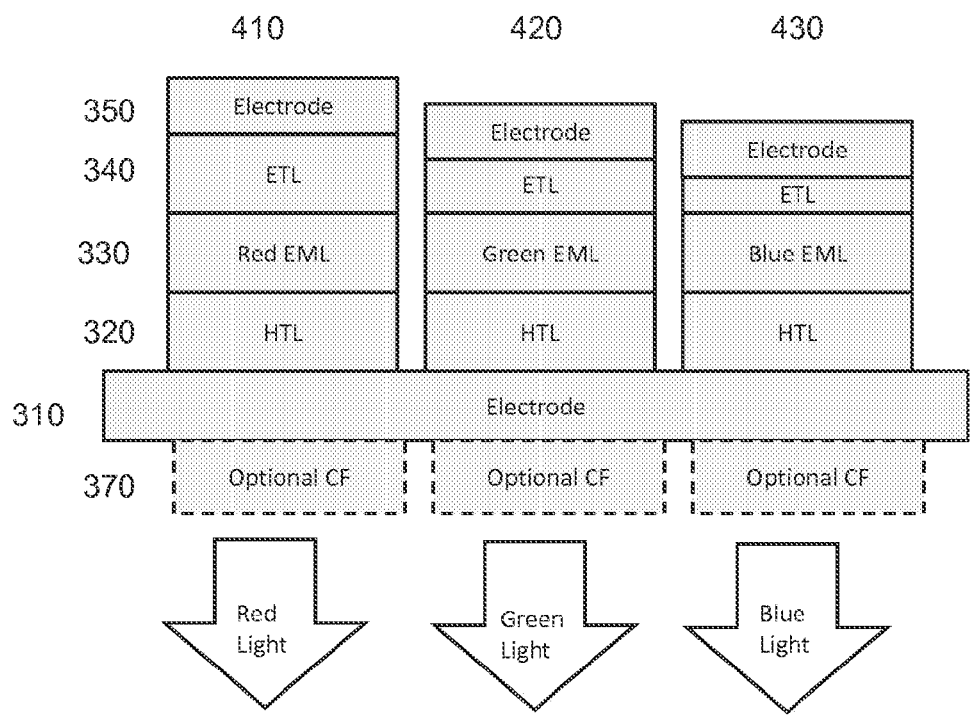
FIG. 11 shows a schematic cross sections of a bottom-emitting device structure with different thicknesses of an ETL and optional color filter layers under the transparent substrate.

FIG. 11 shows a schematic cross section of a bottom-emitting device structure with different thicknesses of ETL 340, and includes different colored EML 330 and color filter layer 370 under the transparent substrate.

Figure 12:
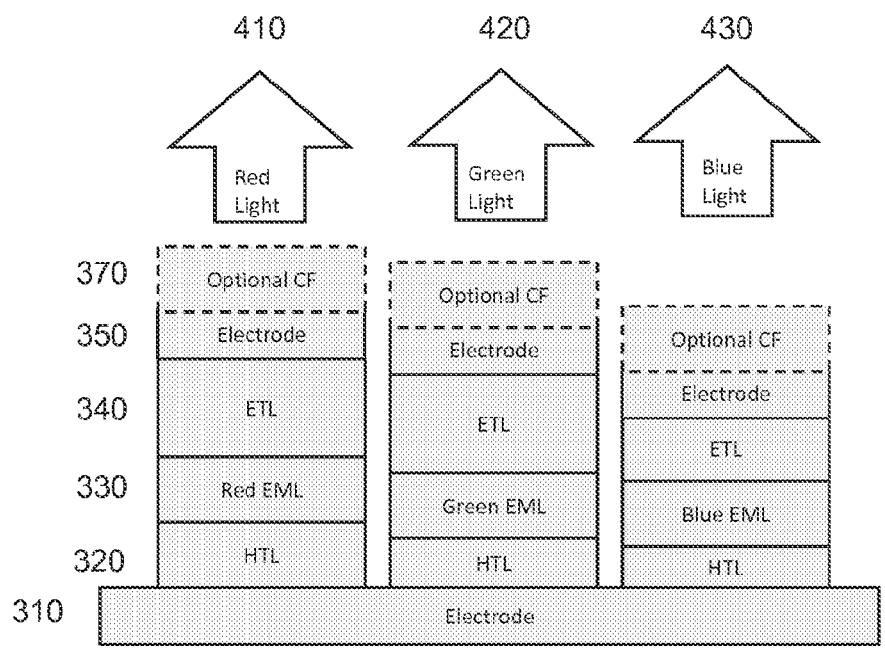
FIG. 12 shows a schematic cross sections of a top-emitting device structure with different thicknesses of an HTL and ETL and optional color filter layers over the sub-pixels.

FIG. 12 shows a schematic cross section of a top-emitting device structure with different thicknesses of HTL 320 and ETL 340, and includes different colored EML 330 and color filter layer 370 over the sub-pixels.

Figure 13:
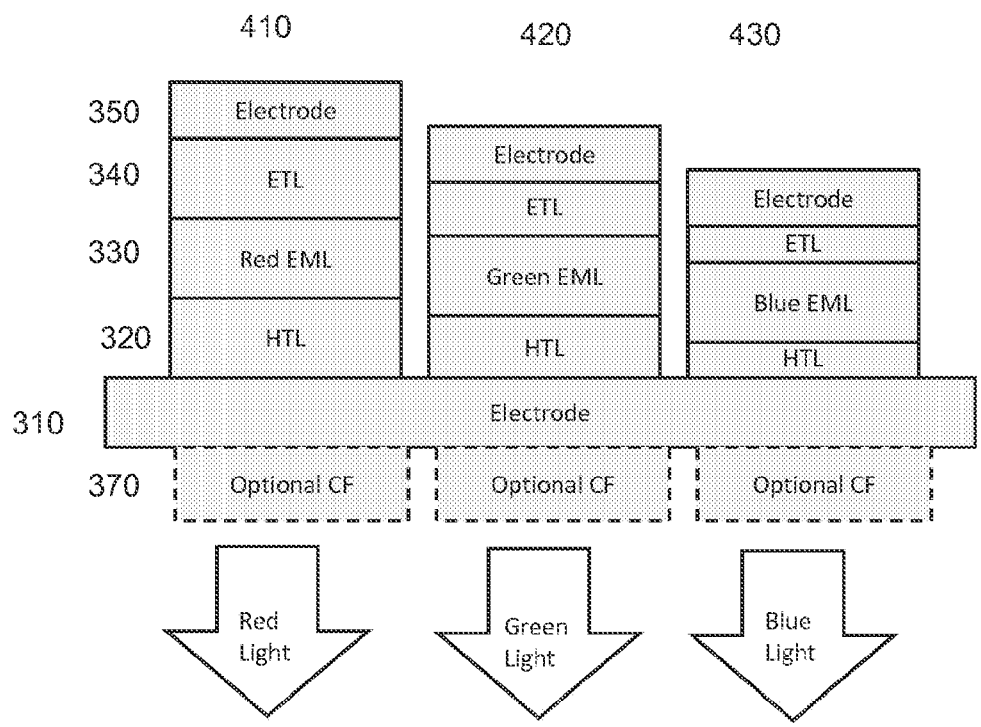
FIG. 13 shows a schematic cross sections of a bottom-emitting device structure with different thicknesses of an HTL and ETL and optional color filter layers under the transparent substrate.

FIG. 13 shows a schematic cross section of a bottom-emitting device structure with different thicknesses of HTL 320 and ETL 340, and includes different colored EML 330 and color filter layer 370 under the transparent substrate.

Figure 14:
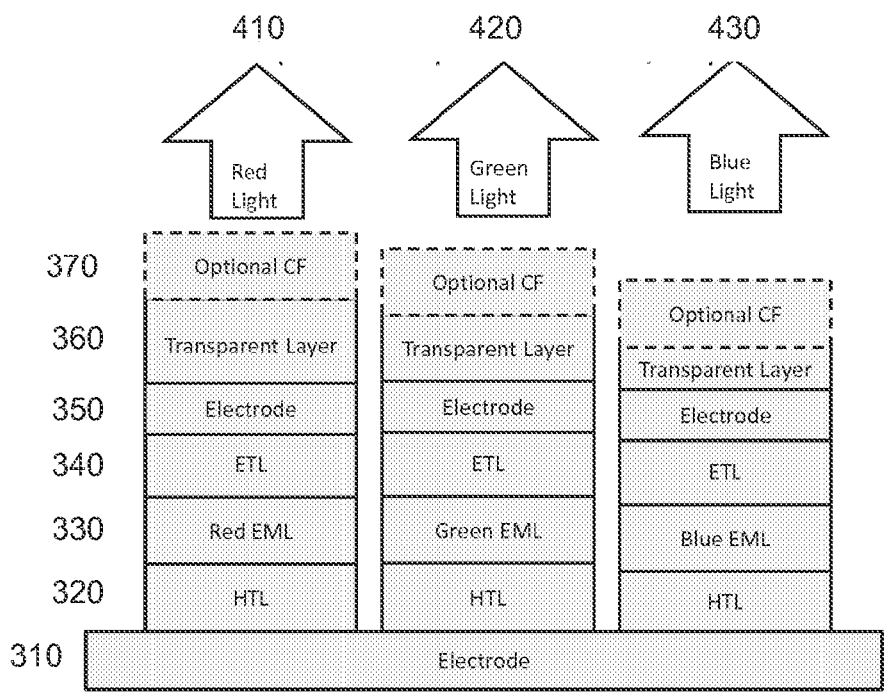
FIG. 14 shows a schematic cross sections of a top-emitting device structure with different thicknesses of a transparent layer and optional color filter layers over the sub-pixels.

FIG. 14 shows a schematic cross section of a top-emitting device structure with different colored EML 330, different thicknesses of a transparent layer 360, and a color filter layer 370 over the sub-pixels.

Figure 15:
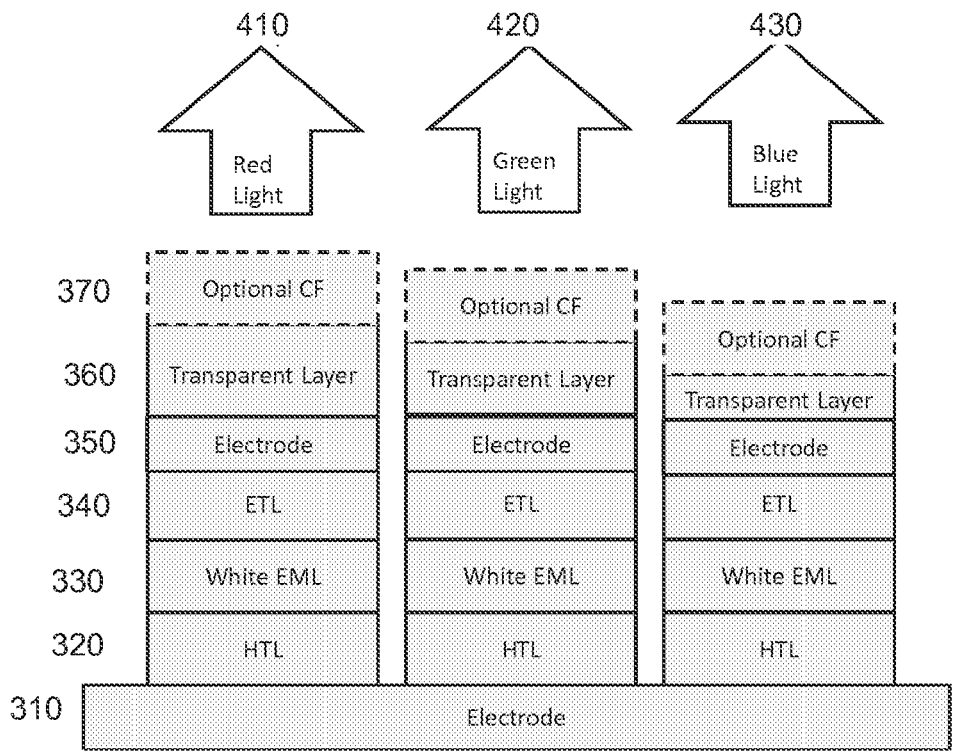
FIG. 15 shows a schematic cross sections of a device with different thicknesses of a transparent layer configured to optimize the outcoupling of different component colors of a white light emitter, and optional color filter layers over the sub-pixels.

FIG. 15 shows a schematic cross section of a top-emitting device with white light EML 330 and different thicknesses of a transparent layer configured to optimize the outcoupling of different component colors of the white light emitter, and color filter layer 370 over the sub-pixels.

Figure 16:
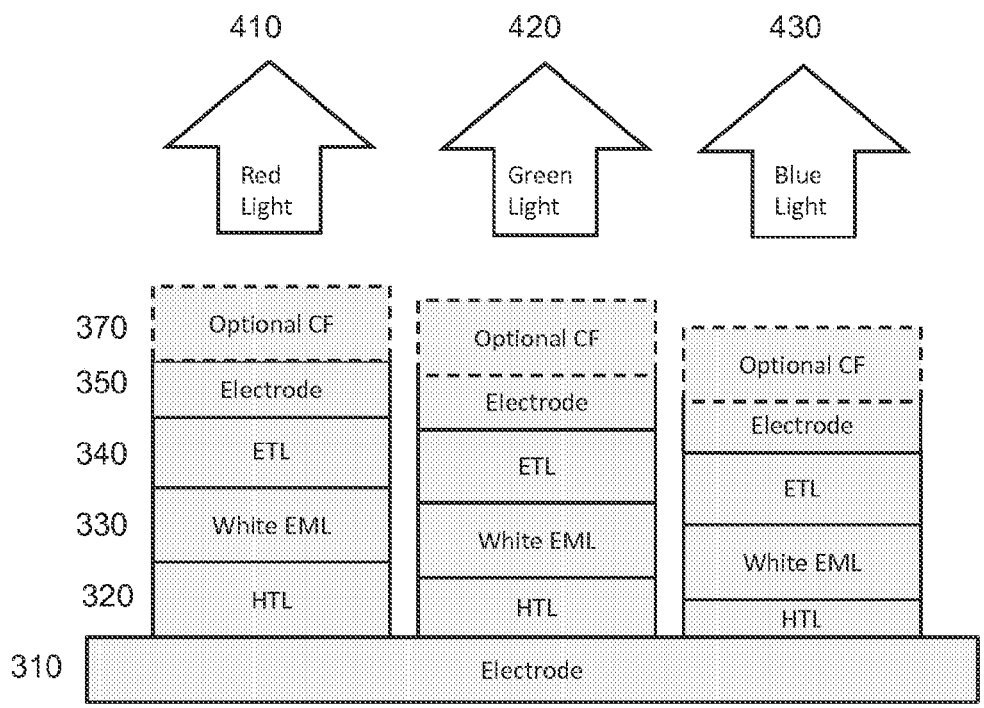
FIG. 16 shows a schematic cross sections of a device with a white light EML, different thicknesses of an HTL, and optional color filter layers over the sub-pixels.

FIG. 16 shows a schematic cross section of a top-emitting device, with a white light EML 330, different thicknesses of HTL 320, and color filter layer 370 over the sub-pixels.

Figure 17:
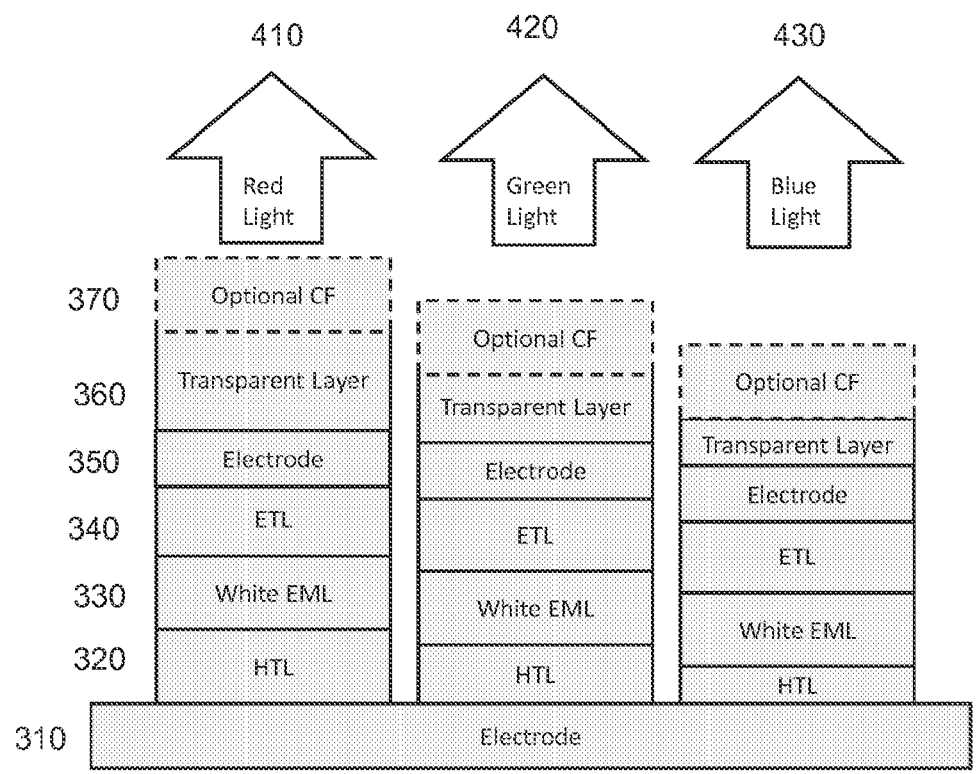
FIG. 17 shows a schematic cross sections of a device with a white light EML, different thicknesses of an HTL and a transparent layer, and optional color filter layers over the sub-pixels.

FIG. 17 shows a schematic cross section of a top-emitting device with a white light EML 330, different thicknesses of both HTL 320 and transparent layer 360, and a color filter layer 370 over the sub-pixels.

Figure 18:
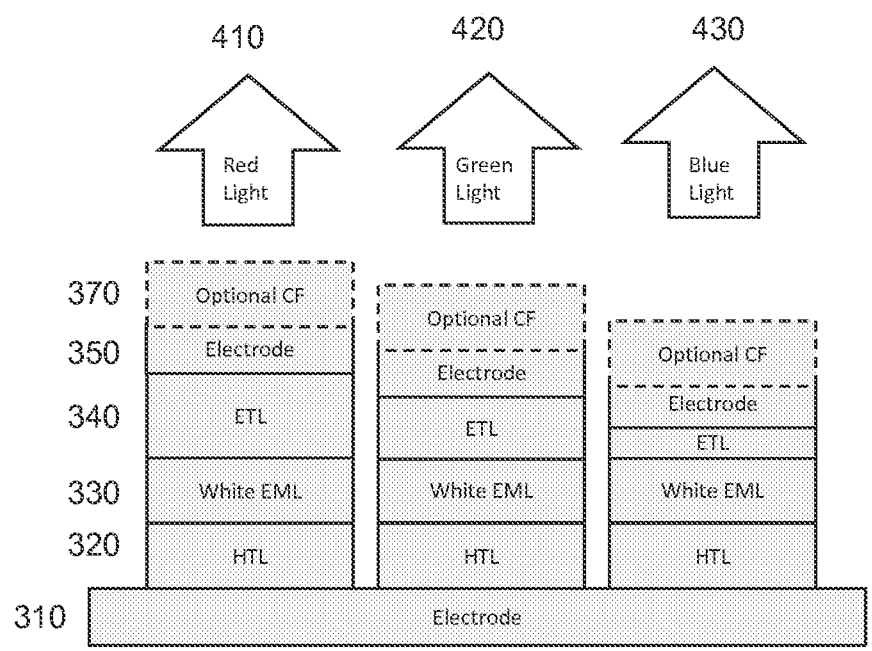
FIG. 18 shows a schematic cross sections of a top-emitting device structure with a white light EML, different thicknesses of an ETL, and optional color filter layers over the sub-pixels.

FIG. 18 shows a schematic cross section of a top-emitting device structure with a white light EML 330, different thicknesses of ETL 340, and a color filter layer 370 over the sub-pixels.

Figure 19:
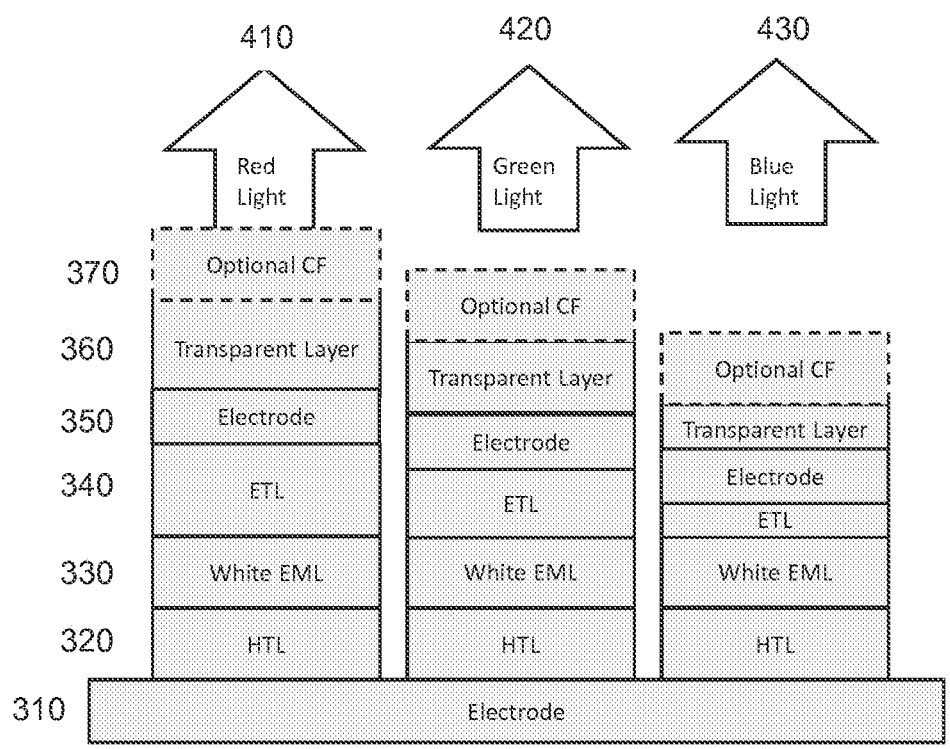
FIG. 19 shows a schematic cross sections of a top-emitting device structure with a white light EML, different thicknesses of an ETL, and transparent layer, and optional color filter layers over the sub-pixels.

FIG. 19 shows a schematic cross section of a top-emitting device structure with a white light EML 330, different thicknesses of both ETL 340 and transparent layer 360, and a color filter layer 370 over the sub-pixels. Transparent layer 360 may be configured to optimize the outcoupling of different component colors of the white light emitter.

Figure 20:
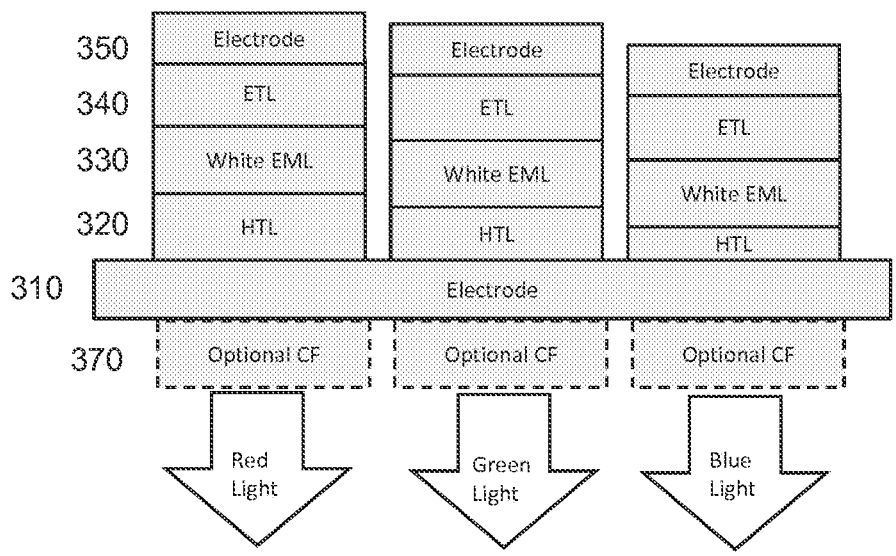
FIG. 20 shows a schematic cross sections of a bottom-emitting device structure with a white light EML, different thicknesses of an HTL, and optional color filter layers under the substrate.

FIG. 20 shows a schematic cross section of a bottom-emitting device structure with a white light EML 330, different thicknesses of HTL 320, and a color filter layer 370 under the substrate.

Figure 21:
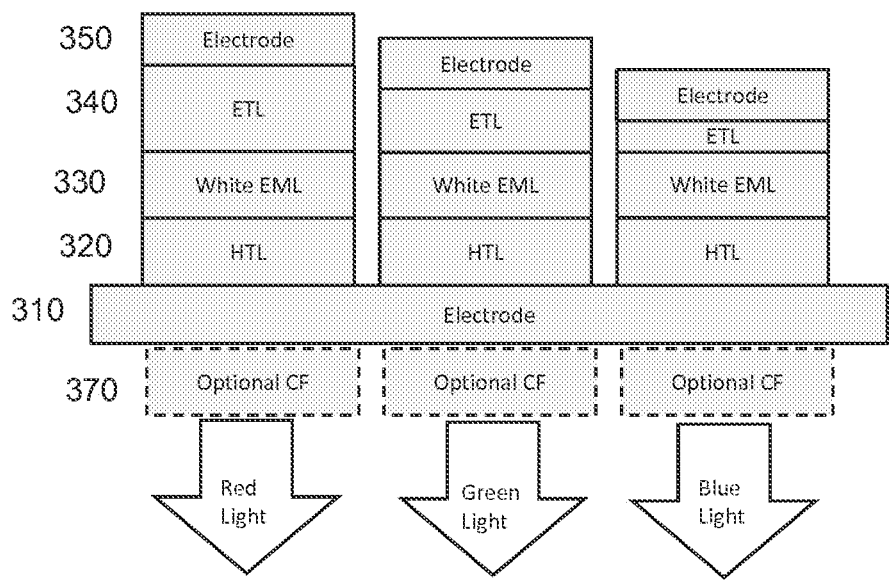
FIG. 21 shows a schematic cross sections of a bottom-emitting device structure with a white light EML, different thicknesses of an ETL, and optional color filter layers under the substrate.

FIG. 21 shows a schematic cross section of a bottom-emitting device structure with a white light EML 330, different thicknesses of ETL 340, and a color filter layer 370 under the substrate.

Figure 22:
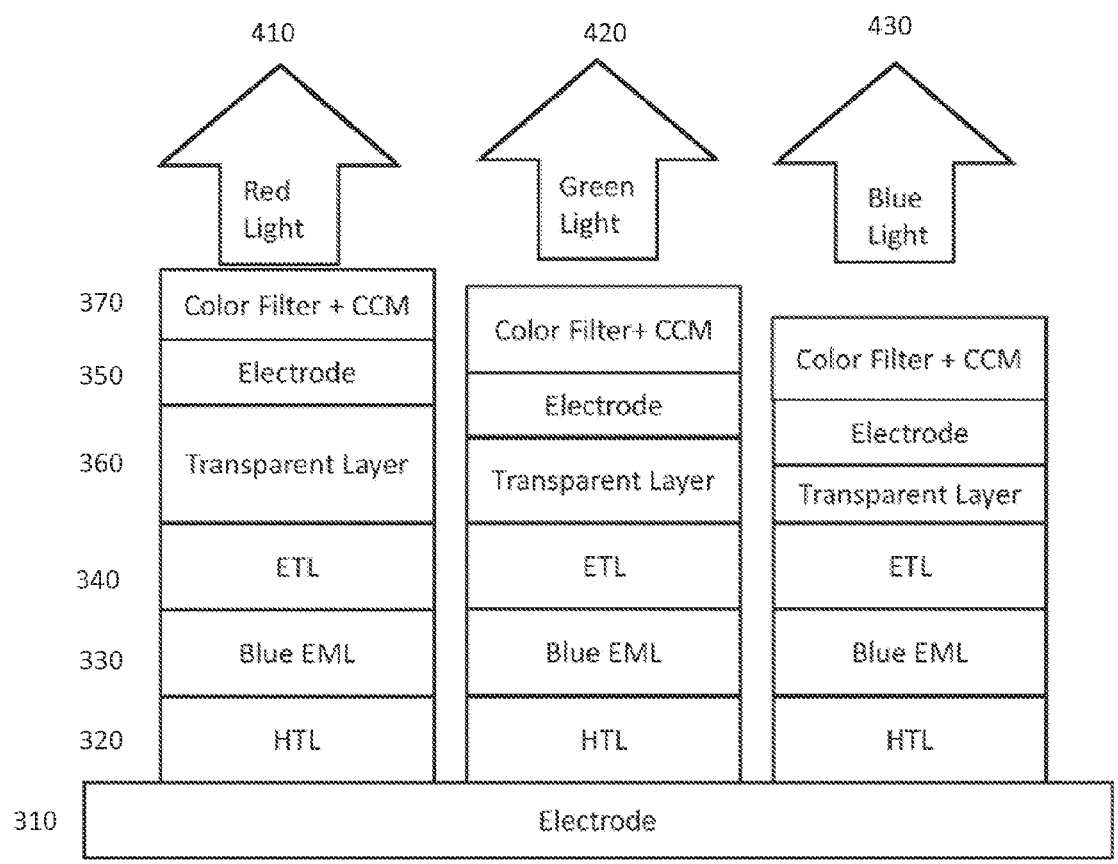
FIG. 22 shows a schematic cross sections of a top-emitting device structure with a blue light EML, different thicknesses of a transparent layer, and optional color filter layers and color conversion material over the sub-pixels.

FIG. 22 shows a schematic cross section of a top-emitting device structure with a blue light EML 330, different thicknesses of transparent spacer layer 360, and a color filter layer 370 and color conversion material over the sub-pixels. In this example, the color filter/conversion layers may be used to change the subpixel color from that of the blue emitters. It should be understood that, in certain embodiments, the color filter layer 370 and color conversion material need not be on all subpixels, i.e. if one of the subpixels is configured to emit the same color as the EML. Transparent layer 360 may be configured to optimize the outcoupling of different component colors of the blue light emitter for the respective color conversion material in each sub-pixel.

Figure 23:
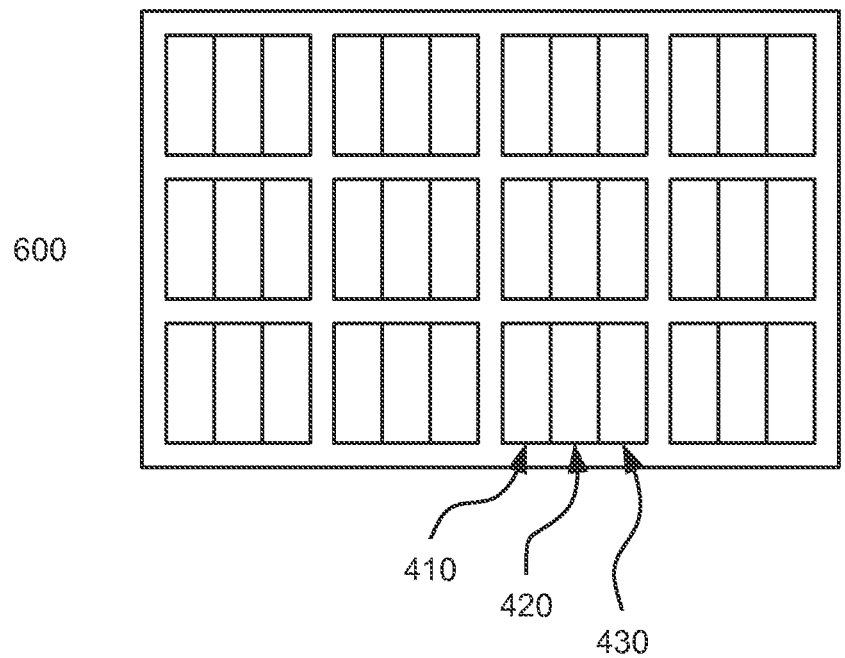
FIG. 23 depicts an exemplary full-color display according to aspects of the invention.

FIG. 23 depicts an exemplary full-color display 600 according to aspects of the invention in which an array of sub-pixels 410, 420 and 430 may be arranged.

Figure 24:
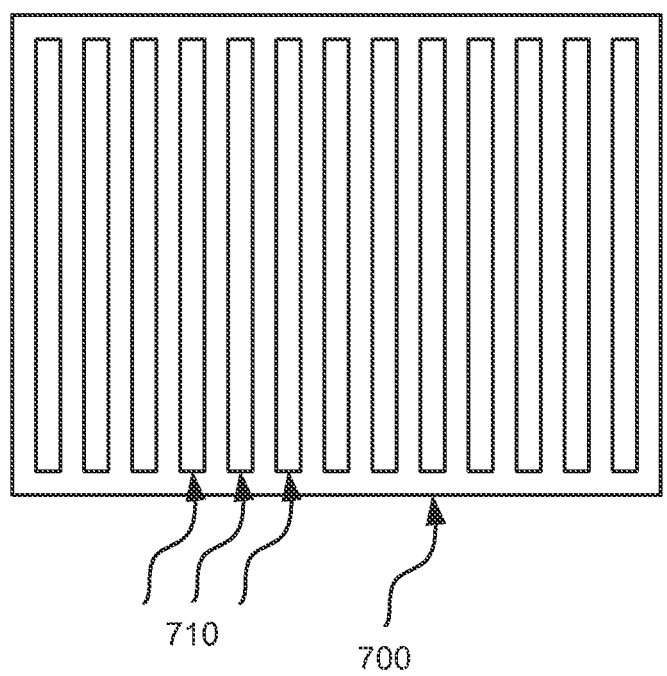
FIG. 24 depicts an exemplary lighting panel according to aspects of the invention.

FIG. 24 depicts an exemplary lighting panel 700 according to aspects of the invention, in which lines of multi-color (or white light) OLEDs 710 may be arranged.

Experimental Results

An embodiment of the invention was reduced to practice by growing five green devices according to the following recipe.

The anode electrode is a multilayer consisting of 500 Å of indium zinc oxide (IZO)/150 Å of Silver (Ag)/200 Å of IZO. The cathode consisted of 10 Å of LiF followed by 1,000 Å of Al. All device examples had organic stacks consisting of, sequentially, from the IZO/Ag/IZO surface, 100 Å thick of Compound A as the hole injection layer (HIL), OVJP printed 'x' Å Compound B (HTL), 300 Å of Compound C doped with 12 wt % of Compound D as the emissive layer (EML). The electron transporting layers (ETL) consisted of 100 Å of Compound E as the ETL1 and 350 Å of Compound F as the ETL2. The OVJP printed HTL thickness 'x' was varied in steps of 350 Å; i.e: 350 Å, 700 Å, 1050 Å, 1400 Å, 1750 Å in devices A through E respectively. Thus device A has a printed HTL thickness of 350 Å, device B has a printed HTL thickness of 700 Å etc. All the organic and cathode layers were deposited by high vacuum (<$10^{-7}$ Torr) thermal evaporation except for the OVJP printed α-NPD HTL. All devices were encapsulated with a glass lid sealed with an epoxy resin in a nitrogen glove box (<1 ppm of $H_2O$ and $O_2$) immediately after fabrication, and a moisture getter was incorporated inside the package.

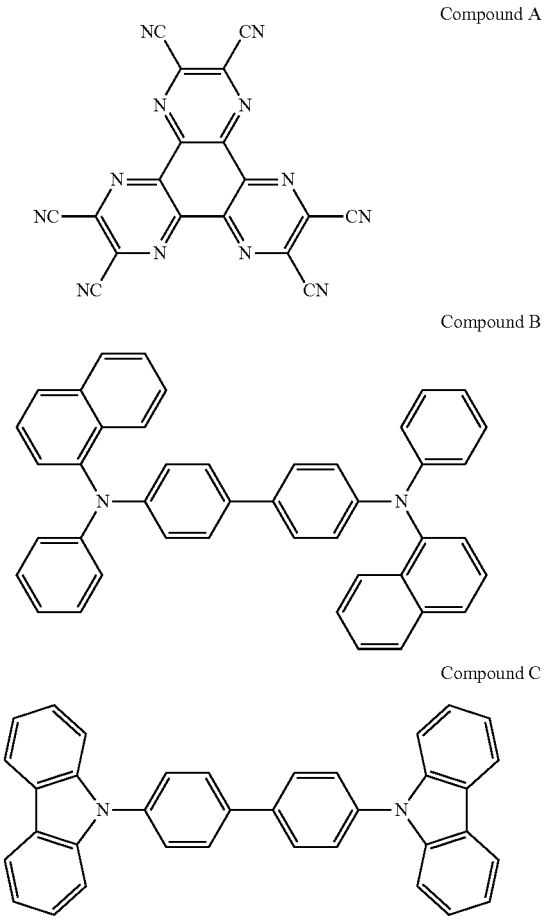

Compound A

Compound B

Compound C

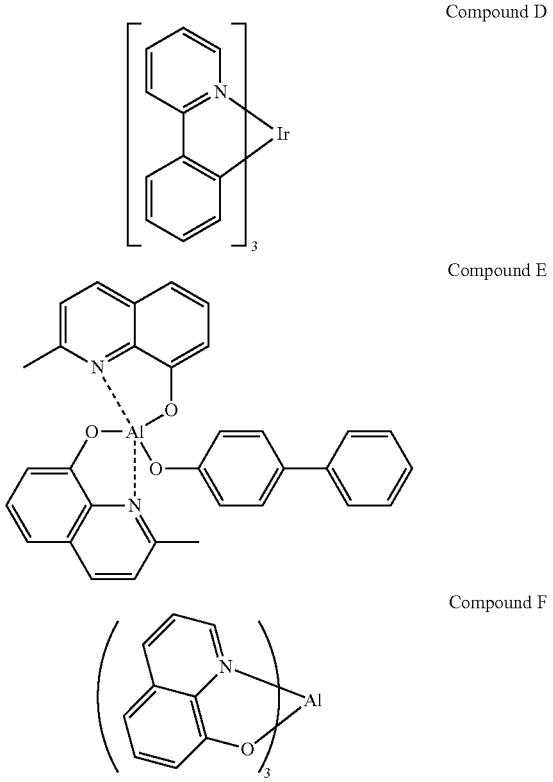

Compound D

Compound E

Compound F

Figure 25:
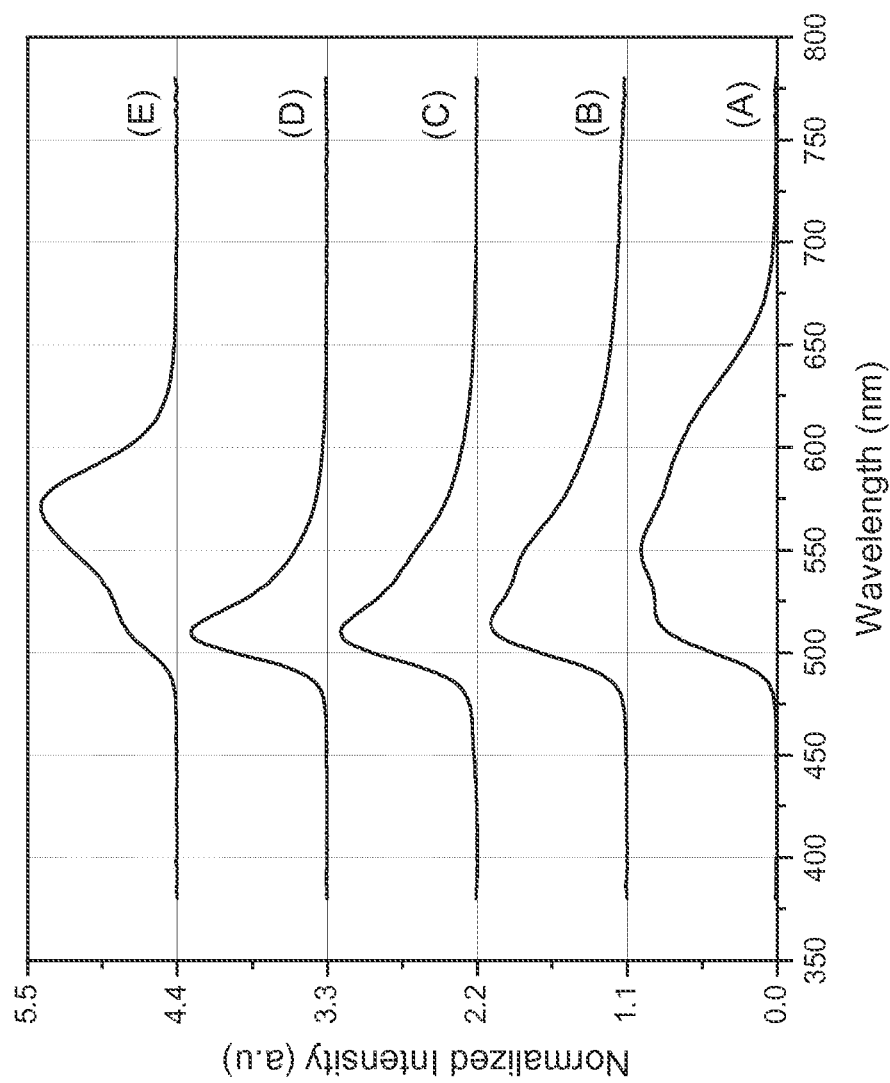
FIG. 25 shows spectral output results from an embodiment where the HTL thickness is adjusted using OVJP deposition to optimize the color purity of a green OLED.

The spectral results and device performance are shown in FIG. 25, and below in Table 1, respectively.

TABLE 1

| Device Performance @ 1000 nits | A HTL = 350 Å | B HTL = 700 Å | C HTL = 1050 Å | D HTL = 1400 Å | E HTL = 1750 Å |
| --- | --- | --- | --- | --- | --- |
| LE (cd/A) | 16 | 7 | 8 | 21 | 20 |
| EQE % | 4.9 | 2.2 | 2.5 | 6.5 | 5.4 |
| Peak Wavelength (nm) | 551 | 514 | 510 | 510 | 573 |
| FWHM (nm) | 122 | 76 | 50 | 34 | 87 |
| CIE (x, y) | (0.412, 0.551) | (0.333, 0.597) | (0.246, 0.613) | (0.179, 0.677) | (0.410, 0.583) |

An optimum thickness of HTL for spectral purity and efficiency of the green light is 1400 Å. In an optimized RGB device, therefore, this thickness of HTL may be printed using OVJP on the green subpixels. Other thicknesses may be printed on the red and blue subpixels, each optimized for the outcoupling of their color, respectively.

As used herein, "red" means having a peak wavelength in the visible spectrum of 600-700 nm, "green" means having a peak wavelength in the visible spectrum of 500-600 nm, "light blue" typically means having a peak wavelength in the visible spectrum of 460-500 nm, and "deep blue" typically means having a peak wavelength in the visible spectrum of 400-470 nm. Preferred ranges include a peak wavelength in the visible spectrum of 610-640 nm for red and 510-550 nm for green.

To add more specificity to the wavelength-based definitions, "light blue" may be further defined, in addition to having a peak wavelength in the visible spectrum of 460-500 nm that is at least 4 nm greater than that of a deep blue OLED in the same device, as preferably having a CIE x-coordinate less than 0.2 and a CIE y-coordinate less than 0.5, and "deep blue" may be further defined, in addition to having a peak wavelength in the visible spectrum of 400-470 nm, as preferably having a CIE y-coordinate less than 0.3, preferably less than 0.2, and most preferably less than 0.1, and the difference between the two may be further defined such that the CIE coordinates of light emitted by the third organic light emitting device and the CIE coordinates of light emitted by the fourth organic light emitting device are sufficiently different that the difference in the CIE x-coordinates plus the difference in the CIE y-coordinates is at least 0.01. As defined herein, the peak wavelength is the primary characteristic that defines light and deep blue, and the CIE coordinates are preferred.

More generally, "light blue" may mean having a peak wavelength in the visible spectrum of 400-500 nm, and "deep blue" may mean having a peak wavelength in the visible spectrum of 400-500 nm, and at least 4 nm less than the peak wavelength of the light blue. In sonic circumstances, embodiments of the invention may be described as including "a blue EML" and "the other blue EML" to generally refer to a LB EML and a DB EML, or vice versa.

In another embodiment, "light blue" may mean having a CIE y coordinate less than 0.25, and "deep blue" may mean having a CIE y coordinate at least 0.02 less than that of "light blue."

In another embodiment, the definitions for light and deep blue provided herein may be combined to reach a narrower definition. For example, any of the CIE definitions may be combined with any of the wavelength definitions. The reason for the various definitions is that wavelengths and CIE coordinates have different strengths and weaknesses when it comes to measuring color. For example, lower wavelengths normally correspond to deeper blue. But a very narrow spectrum having a peak at 472 may be considered "deep blue" when compared to another spectrum having a peak at 471 nm, but a significant tail in the spectrum at higher wavelengths. This scenario is best described using CIE coordinates. It is expected that, in view of available materials for OLEDs, that the wavelength-based definitions are well-suited for most situations. In any event, embodiments of the invention include two different blue emitters in a single device, however the difference in blue is measured.

Different types of devices may be used in different lighting applications. For example, a white lighting panel 700, such as shown in FIG. 24, may include a plurality of similar white lighting devices 710 (in this case white light emitting strips). On the other hand, as shown in FIG. 23, a substantially blue emitter may be used together with, for example, a red emitter and a green emitter to form pixels of a multi-color display 600. "Red" and "green" phosphorescent devices having lifetimes and efficiencies suitable for use in a commercial display are well known and readily achievable, including devices that emit tight sufficiently close to the various industry standard reds and greens for use in a display. Examples of such devices are provided in M. S. Weaver, V. Adamovich, B. D'Andrade, B. Ma, R. Kwong, and J. J. Brown, Proceedings of the international Display Manufacturing Conference, pp. 328-331

(2007); see also B. D'Andrade, M. S. Weaver, P. B. MacKenzie, H. Yamamoto, J. J. Brown, N. C. Giebink, S. R. Forrest and M. E. Thompson, Society for Information Display Digest of Technical Papers 34, 2, pp. 712-715 (2008).

Other combinations are also possible, and will be appreciated by those of skill in the art. For example, any number of different color combination sub-pixels may be included in the pixel of a multi color display such as shown in FIG. 23. Additionally, in certain circumstances, it may be advantageous to include both a substantially blue emitting device as described herein with a white emitting device, and/or any number of other color emitting devices.

Various types of OLEDs may be used to implement various configurations, including transparent OLEDs and flexible OLEDs.

A single pixel may incorporate three or more sub-pixels such as those disclosed herein, possibly with more than three discrete colors. Systems including the described lighting devices may include mostly blue light emitting devices, non-blue emitting devices, white light emitting devices, and combinations thereof.

It is understood that the various embodiments described herein are by way of example only, and are not intended to limit the scope of the invention. For example, many of the materials and structures described herein may be substituted with other materials and structures without deviating from the spirit of the invention. The present invention as claimed may therefore include variations from the particular examples and preferred embodiments described herein, as will be apparent to one of skill in the art. It is understood that various theories as to why the invention works are not intended to be limiting.

We claim:

1. A method of fabricating a device having at least laterally patterned first and second sub-devices, the method comprising:
   depositing via organic vapor jet printing (OVJP) a first organic layer of the first sub-device and a first organic layer of the second sub-device;
   wherein the first organic layer of the first sub-device and the first organic layer of the second sub-device have different thicknesses;
   wherein the first organic layer of the first sub-device and the first organic layer of the second sub-device have the same material composition; and
   wherein the first organic layer of the first sub-device and the first organic layer of the second sub-device are both the same type of layer, and wherein the type of layer is selected from an ETL, an HTL, an HIL, a spacer and a capping layer.

2. The method of claim 1 wherein the first organic layer of the first sub-device and the first organic layer of the second sub-device are deposited at the same time.

3. The method of claim 1 wherein the first organic layer of the first sub-device and the first organic layer of the second sub-device are deposited at different times.

4. The method of claim 1 wherein the first organic layer of the first sub-device and the first organic layer of the second sub-device are disposed within optical cavities.

5. The method of claim 1 wherein the first and second sub-devices are OLEDs.

6. The method of claim 5, wherein the first and second sub-devices each emit a different color of light.

7. The method of claim 5 wherein the device farther includes a third sub-device, and the first, second and third sub-devices each emit a different color of light.

8. The method of claim 7 wherein the first, second and third devices each emit a different color selected from red, green and blue.

9. The method of claim 1 wherein the first organic layer of the first sub-device and the first organic layer of the second sub-device are both an ETL.

10. The method of claim 1 wherein the first organic layer of the first sub-device and the first organic layer of the second sub-device are both an HTL.

11. The method of claim 1 wherein the first organic layer of the first sub-device and the first organic layer of the second sub-device are both an HIL.

12. The method of claim 1 wherein the first organic layer of the first sub-device and the first organic layer of the second sub-device are both a spacer.

13. The method of claim 1 wherein the first organic layer of the first sub-device and the first organic layer of the second sub-device are both a capping layer.

14. The method of claim 1 wherein the first organic layer of the first sub-device and the first organic layer of the second sub-device have a thickness difference greater than approximately 10 Å.

15. The method of claim 1 wherein the first organic layer of the first sub-device and the first organic layer of the second sub-device have a thickness difference greater than approximately 20 Å.

16. The method of claim 1 wherein the first organic layer of the first sub-device and the first organic layer of the second sub-device have a thickness difference in a range of approximately 10 Å-1000 Å.

17. The method of claim 1 wherein the lateral separation between the first and second sub-devices is at most 1.0 mm.

18. The method of claim 1 wherein the device is a consumer device.

19. The method of claim 1, wherein the device is incorporated into an optoelectronic device.

20. The method of claim 19 wherein the optoelectronic device is incorporated into one of a vehicle, a computer, a television, a printer, a large area wall, a theater or stadium screen, a billboard, or a sign.

* * * * *